United States Patent
Akimichi

(10) Patent No.: US 7,187,198 B2
(45) Date of Patent: Mar. 6, 2007

(54) PROGRAMMABLE LOGIC DEVICE

(75) Inventor: Toshikado Akimichi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 186 days.

(21) Appl. No.: 11/063,981

(22) Filed: Feb. 24, 2005

(65) Prior Publication Data

US 2006/0091899 A1 May 4, 2006

(30) Foreign Application Priority Data

Nov. 4, 2004 (JP) ............................. 2004-320416

(51) Int. Cl.
*H03K 19/173* (2006.01)
(52) U.S. Cl. .............................. 326/38; 326/9
(58) Field of Classification Search ................ 326/9, 326/10, 16, 37–41; 714/25, 724, 725
See application file for complete search history.

(56) References Cited

U.S. PATENT DOCUMENTS

| | | | | |
|---|---|---|---|---|
| 4,899,067 | A | * | 2/1990 | So et al. .................. 326/38 |
| 5,925,920 | A | * | 7/1999 | MacArthur et al. ......... 257/530 |
| 6,167,558 | A | * | 12/2000 | Trimberger ................ 716/16 |
| 6,504,771 | B2 | | 1/2003 | Shionoya |
| 6,691,264 | B2 | * | 2/2004 | Huang ..................... 714/723 |

2002/0154559 A1 10/2002 Shionoya

FOREIGN PATENT DOCUMENTS

| | | |
|---|---|---|
| EP | 1 251 525 A1 | 10/2002 |
| JP | 05-267607 | 10/1993 |
| JP | 11-211794 | 8/1999 |
| JP | 2002-319296 | 10/2002 |

* cited by examiner

*Primary Examiner*—Don Le
(74) *Attorney, Agent, or Firm*—Arent Fox PLLC

(57) ABSTRACT

The present invention aims to provide a programmable logic device (PLD), and a related control program, capable of improving a product yield by avoiding a defect point according to defect point detected after PLD fabrication.

The PLD includes a plurality of logical blocks including programmable logic circuits; storage in which both circuit information specifying path connecting the plurality of logical blocks using information specifying resources included in the path and defect point information specifying fault resource are stored in advance; replacement control section which refers to defect point information, decides whether fault resource is included in the path specified by circuit information, and when fault path is included, obtains replacement path, and rewrites circuit information with data identifying resources included in replacement path; and wiring resource section which reads out circuit information stored in storage, and forms a predetermined logic circuit based on readout circuit information.

15 Claims, 19 Drawing Sheets

FIG. 7A

| LOGICAL BLOCK | PATH | FAULT REFLECTION COMPLETION FLAG |
|---|---|---|
| a to i | (a)-SW5-5H8-SW8-8H11-SW11-(i) | No |

FIG. 7B

| LOGICAL BLOCK | PATH | FAULT REFLECTION COMPLETION FLAG |
|---|---|---|
| a to i | (a)-SW5-5H8-SW8-8H9-SW9-9H12-SW12-12H15-SW15-15H14-SW14-14H11-SW11-(i) | Yes |

FIG. 8

| RESOURCE ID | FAULT TYPE |
|---|---|
| SW1 | 1 |
| 1H2 | 3 |
| SW5 | 2 |
| 14H15 | 4 |
| ... | ... |

| LOGICAL BLOCK | PATH | FAULT POSITION | REPLACEMENT PATH | DELAY TIME |
|---|---|---|---|---|
| a to c | ⋮ | ⋮ | ⋮ | ⋮ |
| ⋮ | ⋮ | ⋮ | ⋮ | ⋮ |
| a to i | SW5-5H8-SW8-8H11-SW11 | 8H11 | SW5-5H8-SW8-8H9-SW9-9H12-SW12-12H15-SW15-15H14-SW14-14H11-SW11 | t71 |
| | | | SW5-5H8-SW8-8H7-SW7-7H10-SW10-10H13-SW13-13H14-SW14-14H11-SW11 | t72 |
| | | SW8 | SW5-5H2-SW2-2H1-SW1-1H4-SW4-4H7-SW7-7H10-SW10-10H13-SW13-13H14-SW14-14H11-SW11 | t73 |
| | | ⋮ | ⋮ | ⋮ |

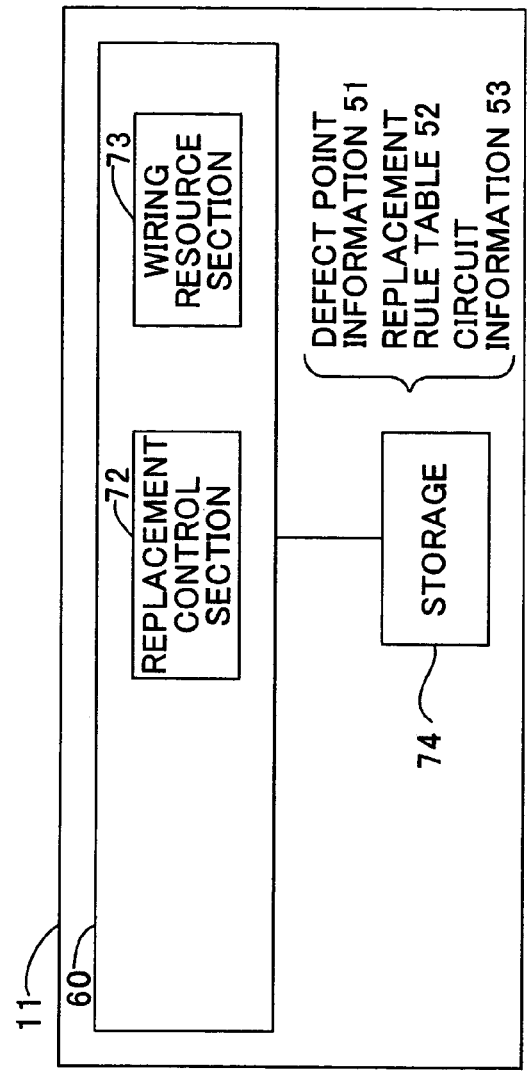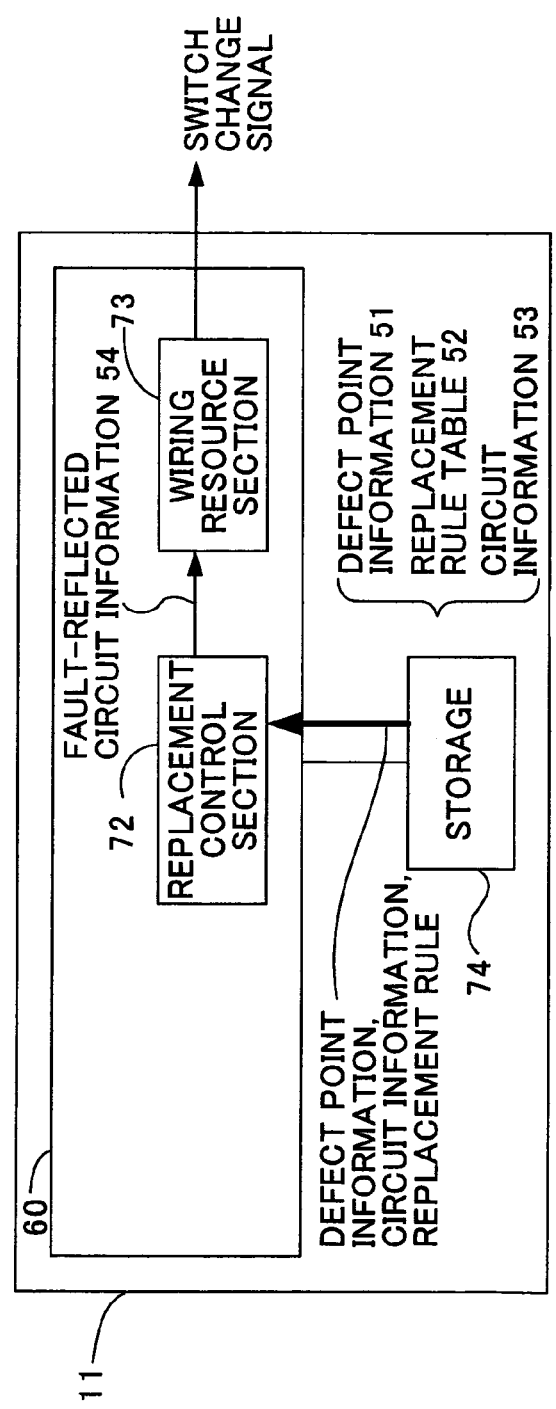

FIG. 16
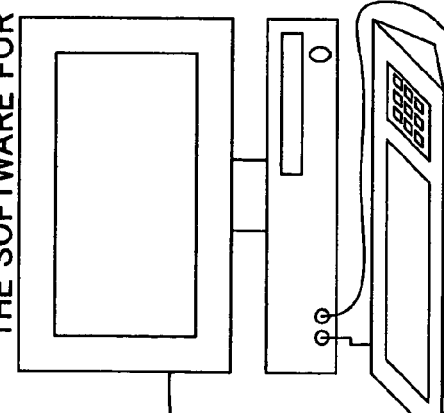
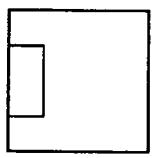
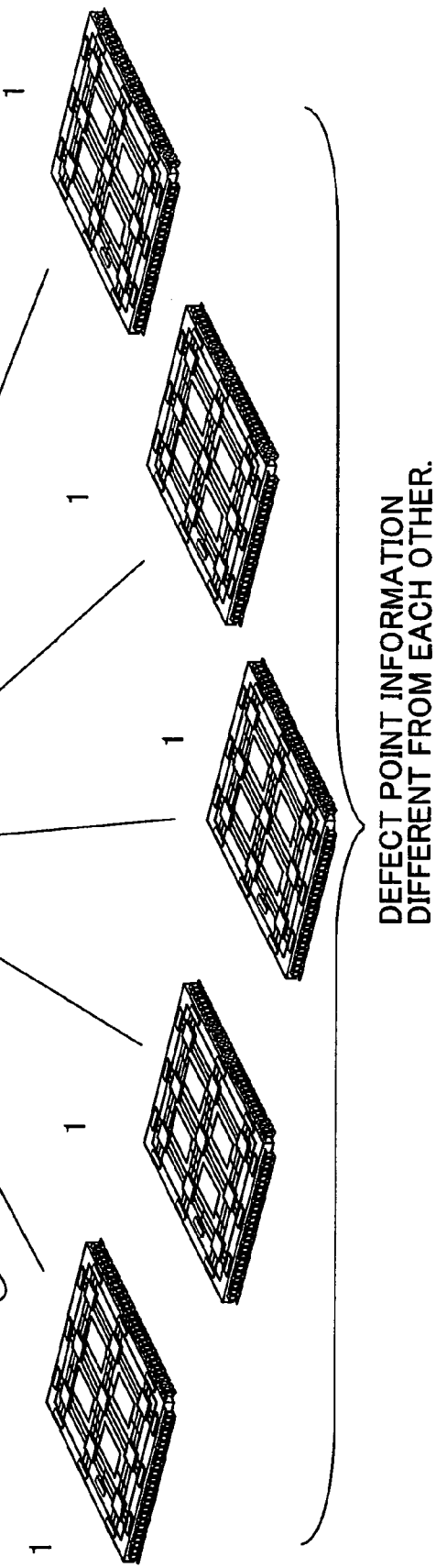

PROGRAMMABLE LOGIC DEVICE

BACKGROUND OF THE INVENTION

1. Field of the Invention

The present invention relates to a programmable logic device, and more particularly a programmable logic device capable of relieving a defective product and thereby improving a yield, and a control program, a circuit forming method and a circuit design system related thereto, and an apparatus having the programmable logic device mounted thereon.

2. Description of the Related Art

Presently, circuit design using a programmable logic device (hereafter abbreviated as PLD) is widely carried out. In a programmable logic device chip, wiring of an internal circuit group can be designed externally, and logic operation can be programmed even after manufacturing. The PLD includes a complex programmable logic device (CPLD) and a field programmable gate array (FPGA).

The PLD has a storage for storing circuit information specifying a design of the wiring connections of the internal circuit group, and the logic operation can be programmed arbitrarily by modifying the circuit information stored in the storage. The wiring connection design of the internal circuit group can be performed by executing a program, which is called allocation and wiring software, executed in information processing equipment such as a personal computer (PC) being externally connected to the PLD via a parallel cable, etc. In many cases, PLD manufacturers provide the allocation and wiring software or a program (write software) for storing the circuit information into the storage, to developers free of charge. Therefore, once purchasing the PLD, the developers can perform the circuit design at low cost.

In order to improve a product yield of the PLD in the prior art, redundant elements are incorporated in the device, in addition to the functions which are inherently required. When a defect occurs in the manufacturing process, by using such a redundant element as a replacement, it is possible to relieve the product, which would originally be treated as a defective product without the redundant elements. Such a technique has been used in a memory device. For example, according to the official gazette of the Japanese Unexamined Patent Publication No. 2002-319296, there is disclosed a semiconductor device having redundantly prepared memory blocks, which includes a redundant address decoder to avoid an access to the memory block including a defective element. Also, in the official gazette of the Japanese Unexamined Patent Publication No. H11-211794, there is described a method of replacing with a standby memory cell by disconnecting a metal fuse on the occurrence of a defect. Further, as a prior art related to relief of a defective product, the official gazette of the Japanese Unexamined Patent Publication No. H5-267607, discloses a method of relieving a defect in one base block. According to this disclosure, a set of the input values, which causes an actual output value different from the accurate value to be originally output, is stored in a memory in advance, and the output is reversed when the set of the input values stored in memory is input. Then error is corrected and the base block is relieved.

SUMMARY OF THE INVENTION

However, in such prior arts, process (such as disconnection of wire using a laser) is required in a wafer stage to improve the product yield. It is not possible to deal with a defect which is detected in a later stage after the PLD fabrication. Further, it is not possible to deal with such a defect that exceeds the originally predicted range (of the incorporated redundant element).

Accordingly, it is an object of the present invention to provide a PLD, and a related control program, etc., capable of improving a product yield by avoiding a defect point, depending on each defect point detected after the PLD fabrication. Also, it is another object of the present invention to provide a circuit design system capable of avoiding a defect point depending on each defect point which differs PLD by PLD.

As a first aspect of the present invention, the aforementioned objects can be achieved by providing a programmable logic device which includes: a plurality of logical blocks including programmable logic circuits; a storage which stores in advance circuit information specifying a path connecting the plurality of logical blocks using information identifying resources included in the path, and defect point information identifying a fault resource; a replacement control section which refers to the defect point information, decides whether the fault resource is included in the path specified by the circuit information, and when the fault resource is included, obtains a replacement path, and rewrites the circuit information with the information identifying the resources included in the replacement path; and a wiring resource section which reads out the circuit information stored in the storage, and forms a predetermined logic circuit based on the circuit information read out.

According to a preferred embodiment in the above aspect of the present invention, the programmable logic device further includes: a write control section which refers to the defect point information when the circuit information is stored into the storage, decides whether a fault resource is included in the path specified by the circuit information, obtains the replacement path when the fault resource is included, and rewrites the circuit information with the information identifying resources included in the replacement path.

According to a preferred embodiment in the above aspect of the present invention, the programmable logic device has a replacement rule table stored therein, which includes a path connecting mutually neighboring logical blocks, a resource possibly faulty among resources included in the path connecting the neighboring logical blocks, and a replacement path for use when the resource possibly faulty becomes actually faulty. The replacement path is obtained based on the replacement rule table.

As a second aspect of the present invention, the aforementioned objects can be achieved by providing a control program in a programmable logic device. The programmable logic device includes: a plurality of logical blocks including programmable logic circuits; a storage which stores in advance circuit information specifying a path connecting the plurality of logical blocks using information specifying resources included in the path, defect point information specifying a fault resource, and the control program; and a controller reading out and executing the control program. The control program enables the programmable logic device to realize: a replacement control section which refers to the defect point information, decides whether the fault resource is included in the path specified by the circuit information, obtains a replacement path when the fault resource is included, and rewrites the circuit information with information identifying the resources included in the replacement path; and a wiring resource section which reads out the circuit information stored in the storage, and forms a predetermined logic circuit based on the circuit information read out.

As a third aspect of the present invention, the aforementioned objects can be achieved by providing a circuit forming method for a programmable logic device. The programmable logic device has a plurality of logical blocks including programmable logic circuits, and a storage which stores in advance circuit information specifying a path connecting the plurality of logical blocks using information specifying resources included in the path and defect point information specifying a fault resource. The circuit forming method includes: deciding whether the fault resource is included in the path specified by the circuit information with referring to the defect point information; on deciding that the fault resource is included in the path, rewriting the circuit information with the information identifying the resources included in the replacement path with obtaining a replacement path; and by reading out the circuit information stored in the storage, forming a predetermined logic circuit based on the circuit information read out.

Further scopes and features of the present invention will become more apparent by the following description of the embodiments with the accompanied drawings.

BRIEF DESCRIPTION OF THE DRAWINGS

FIG. 7A shows a diagram illustrating an exemplary data configuration of circuit information, explaining a case of a PLD having no fault.

FIG. 7B shows a diagram illustrating an exemplary data configuration of circuit information, explaining a case of a PLD having a fault in a certain wiring resource.

FIG. 8 shows a diagram illustrating an exemplary data configuration of defect point information stored in advance in a PLD, as a premise of the embodiments described in this specification of the present invention.

FIG. 11A shows a functional block diagram illustrating a control unit of a PLD according to a first embodiment of the present invention, which represents a control unit state in a write phase up to when circuit information is stored into the PLD.

FIG. 11B shows a functional block diagram illustrating a control unit of a PLD according to a first embodiment of the present invention, which represents a control unit state in an initiation phase after the PLD is initiated.

FIG. 16 shows a diagram illustrating a case when a single set of circuit information is to be applied to a plurality of PLDs 1 including defect points.

DETAILED DESCRIPTION OF THE INVENTION

The preferred embodiment of the present invention is described herein after referring to the charts and drawings. However, it is to be noted that the scope of the present invention is not limited to the embodiments described below, but covers the inventions and the equivalents described in the claims.

The basic concept of the embodiments described hereafter in this specification is that a PLD even having a defect point can be made usable as a product by storing in advance information regarding the defect point having been detected after the fabrication of the PLD in a storage inside the PLD. With this, it becomes possible to avoid discarding the PLD even when the PLD has a defect point, and to improve a product yield. Further, schematically, in the embodiments described below, when a predetermined logic circuit designed by a user is realized by use of a PLD having a defect point, a connection state inside the PLD is appropriately set so that the defect point is avoided.

Figure 1:
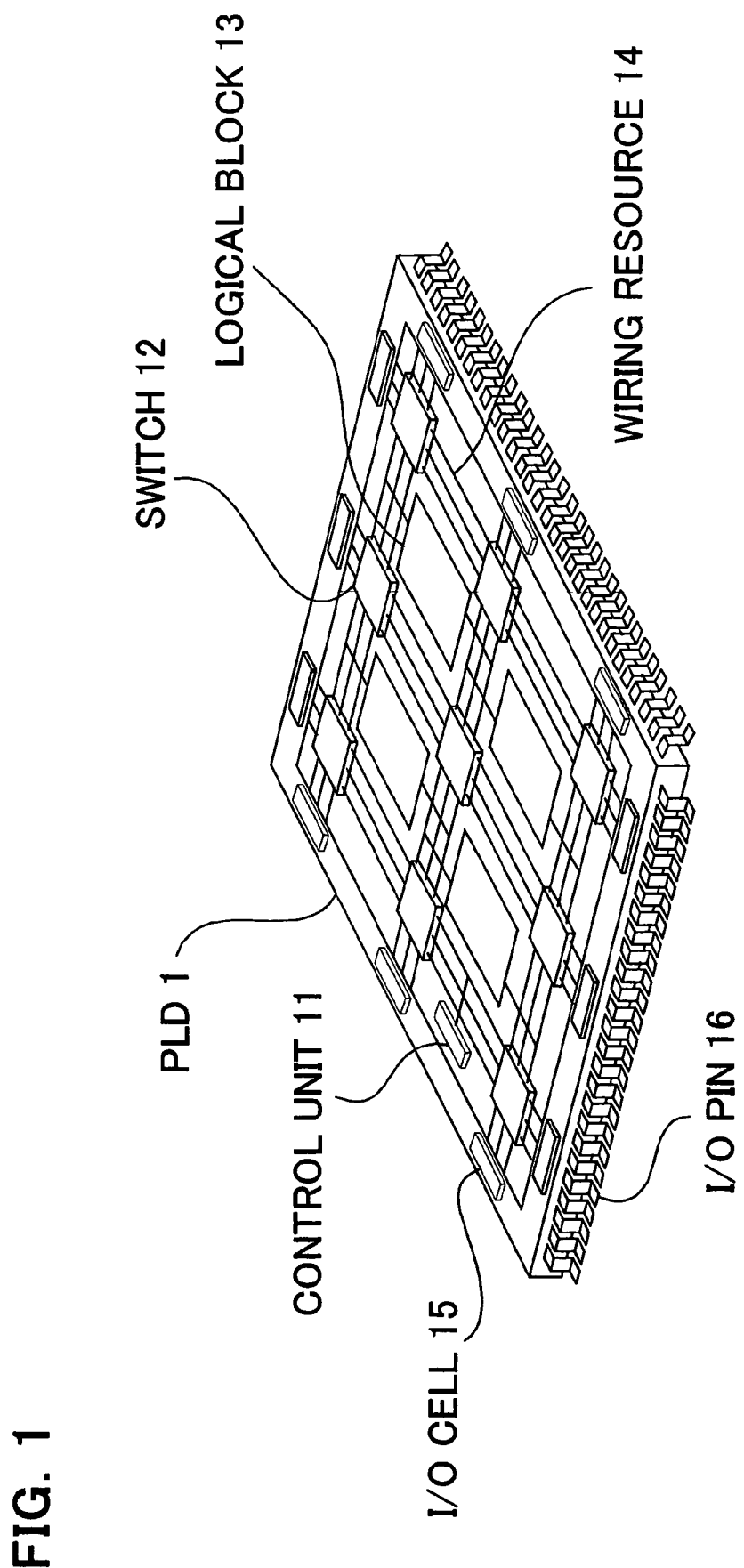
FIG. 1 shows a diagram illustrating a programmable logic device (PLD) according to an embodiment of the present invention.

FIG. 1 is a diagram illustrating a programmable logic device (PLD) 1 according to an embodiment of the present invention. PLD 1 includes: logical blocks 13 for realizing combinational logic circuits represented by the combinations of AND gates and OR gates; wiring resources 14 extending in both longitudinal and lateral directions, being disposed in the periphery of a logical block 13, and used for connecting between logical blocks 13; switches 12 connecting between the wiring resources to be connected; a control unit 11 for controlling each point inside PLD 1; I/O pins 16 functioning as an interface to the outside of PLD 1; and I/O cells 15 directly connected to I/O pins 16 for setting characteristics of I/O pins 16.

Figure 2:
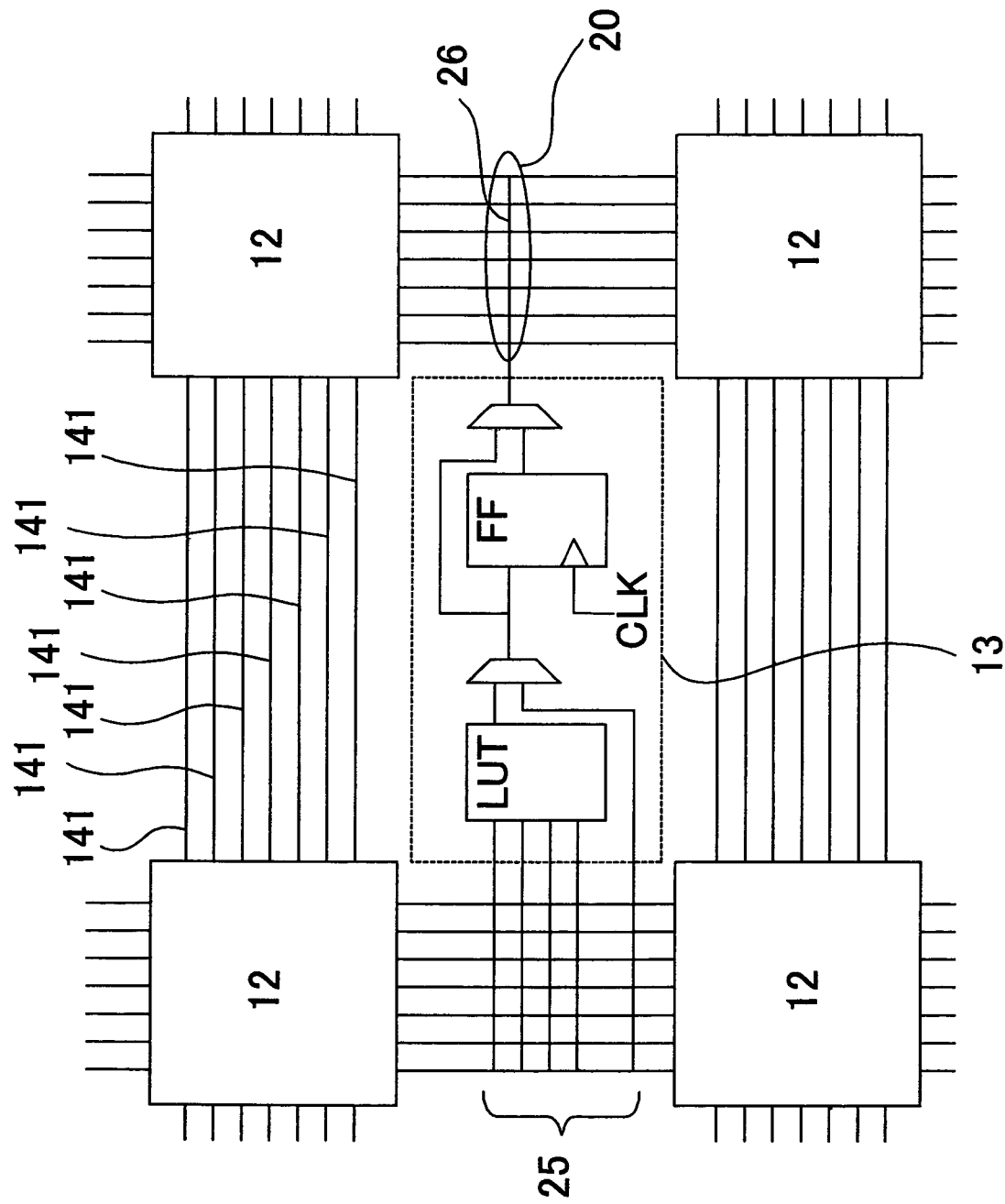
FIG. 2 shows a diagram illustrating a logical block.

FIG. 2 is a diagram illustrating one logical block 13. Logical block 13 includes a lookup table LUT, and a flip-flop FF. Input bits of the lookup table are used for a memory address, and output values corresponding to each memory address are stored in the lookup table. Thus, using the lookup table, an arbitrary combinational logic circuit can be obtained.

In the periphery of logical block 13, switches 12 are disposed at the intersection points of the wiring resources. Switches 12 are mutually connected by a plurality of signal lines 141 included in wiring resources 14. Additionally, switches 12 are also formed at an portion where the wiring resources intersects an input side signal lines 25 input to logical block 13, or an portion where the wiring resources intersects an output side signal lines 26 output from logical block 13 (for example, an intersection portion 20 at the output side line 26 is illustrated in FIG. 2).

Figure 3:
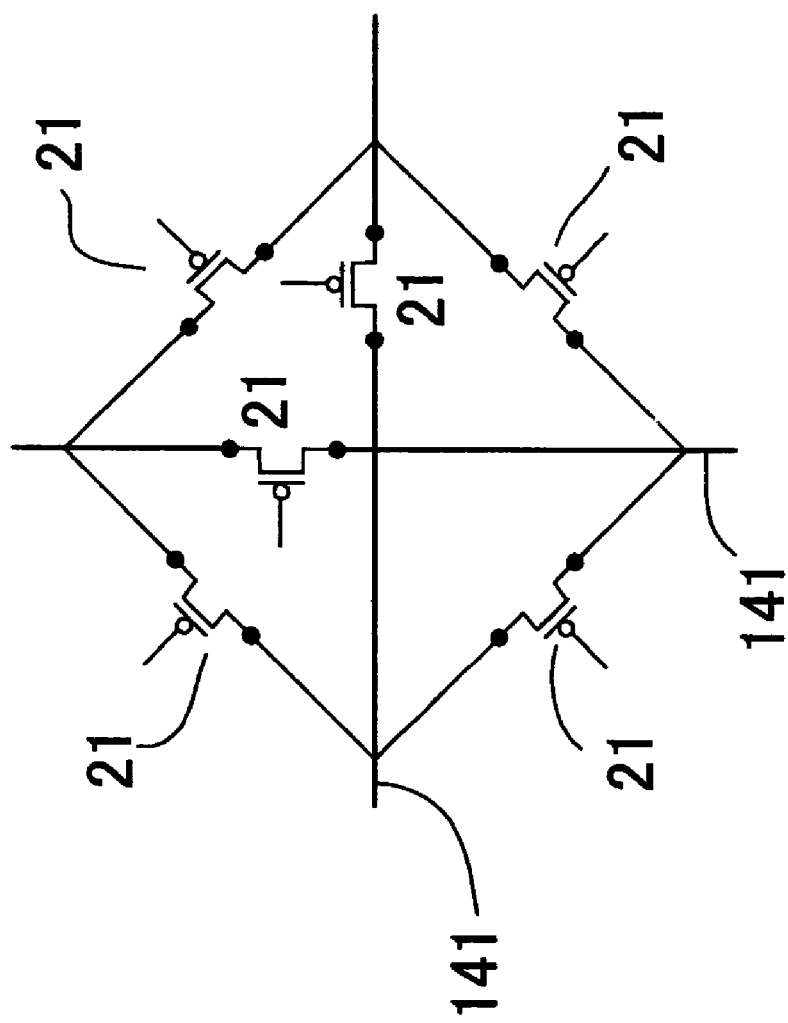
FIG. 3 shows an enlarged diagram of wiring resources intersecting in a switch.

FIG. 3 is an enlarged diagram of wiring resources which intersect in switch 12. As shown in FIG. 3, a transistor switch 21 is disposed at the connection point of the wiring resources directing each logical block. This transistor switch 21 is either connected or disconnected according to a switch change signal from control unit 11. In such a way, it becomes possible to arbitrarily change which and how logical block is to be connected.

The PLD operation is determined by the LUT in each logical block 13, states of the transistor switches in switch 12, and circuit information defining a connection path between each logical block 13. Not only the above-mentioned transistor switch 21, but also the contents of other elements can be arbitrarily changed according to the user design.

In the embodiments described in this specification of the present invention, when switch 12 or wiring resource 14, which are resources included in a connection path between each logical block 13, is faulty, it is intended to improve the product yield by using a replacement path which avoids the fault resource. The circuit information is externally written before the initiation of the PLD.

Figure 4:
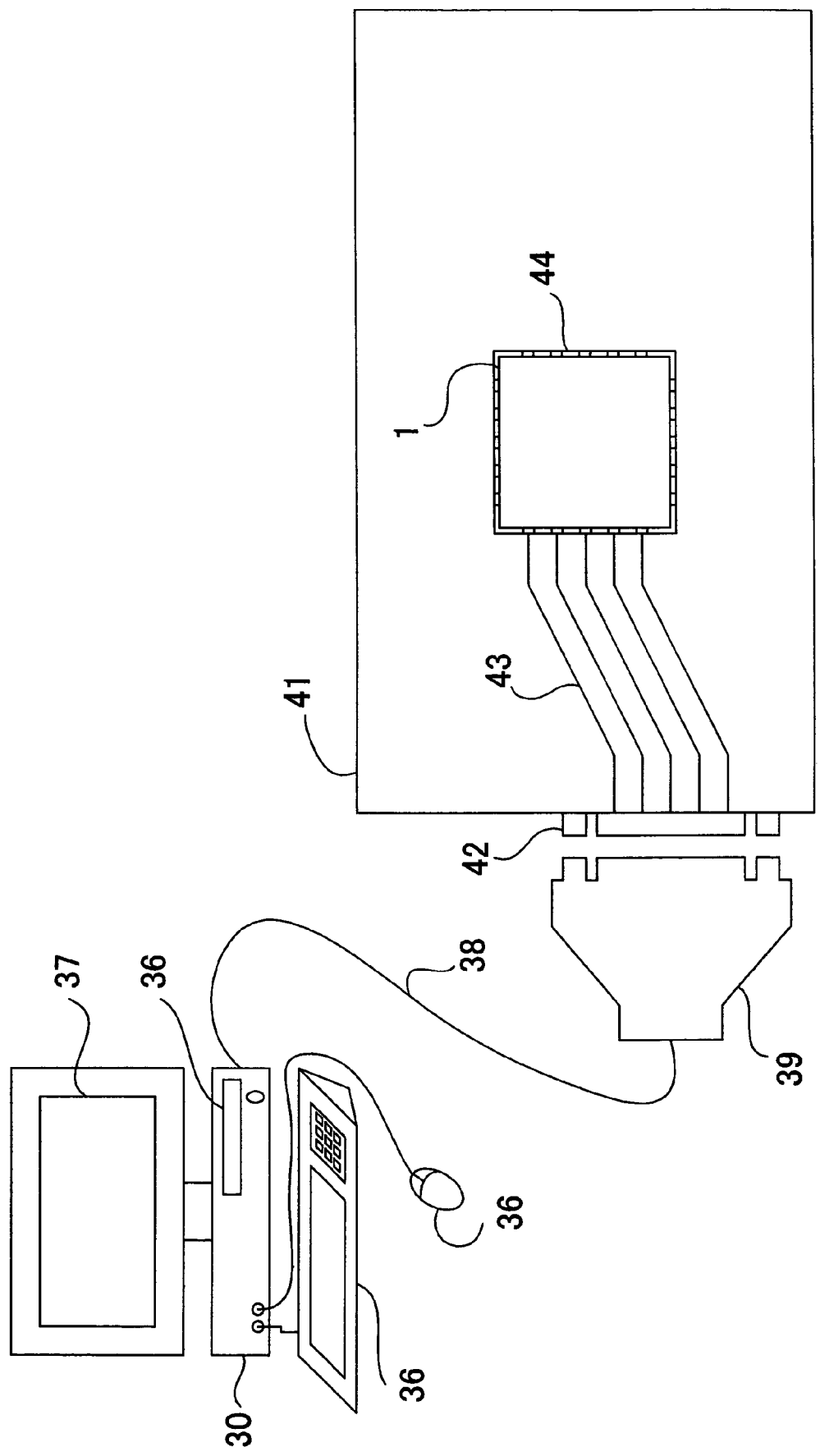
FIG. 4 shows a diagram illustrating an information system for externally writing circuit information into a PLD.

FIG. 4 is a diagram illustrating an information system for externally writing circuit information into a PLD. First, PLD 1 is mounted on a substrate 41 via a detachable socket 44, etc. Substrate 41 is provided with, for example, a parallel port 42 as an external interface. Parallel port 42 is connected to socket 44 by signal lines 43.

Parallel port 42 is connected to a parallel port (not shown) in information processing equipment 30 by parallel cable 38 having a connector 39 of an identical type.

Information processing equipment 30 is a personal computer (PC) or the like, having a display unit 37 for displaying information, a keyboard and a mouse for inputting information, and a drive unit for reading out the contents recorded in a storage medium including compact disc (CD), digital versatile disk (DVD), and magneto-optical (MO) disk. Using the keyboard and/or the mouse, the user can input circuit information into the information processing equipment. Also, using the drive unit, the circuit information stored in the storage medium is read out and input into the information processing equipment. Namely, the keyboard, the mouse and the drive unit function as input section 36.

The circuit information input into information processing equipment 30 in the above-mentioned manner is input to the PLD via a parallel cable, and thus, the circuit information is written into the PLD from external source.

Figure 5:
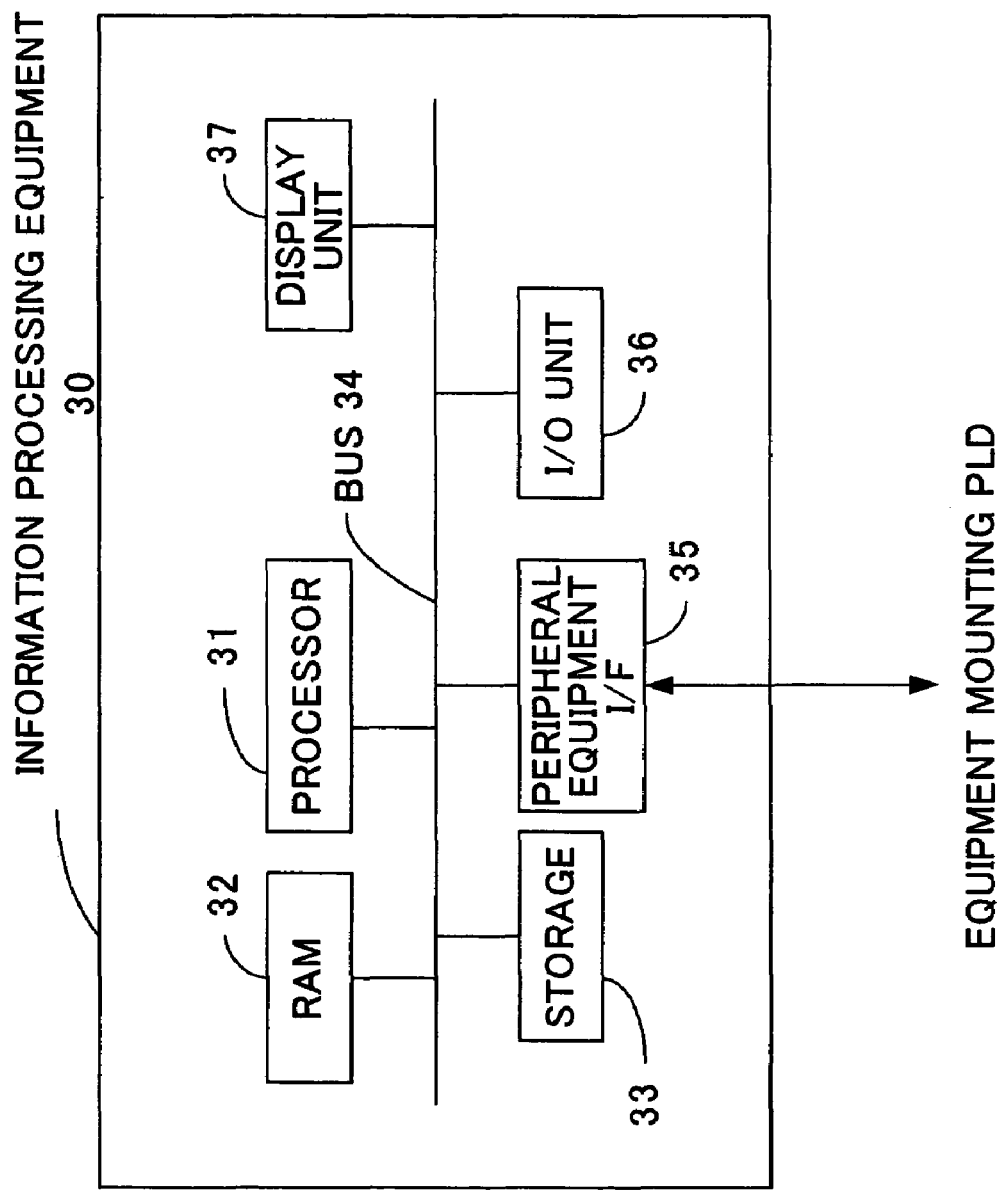
FIG. 5 shows a diagram illustrating a configuration of information processing equipment.

FIG. 5 is a diagram illustrating a configuration of information processing equipment 30. Information processing equipment 30 shown in FIG. 5 includes processor 31, RAM (random access memory) 32, storage 33, interface (I/F) 35 for connecting peripheral equipment, input section 36 for inputting information, and display unit 37 for displaying information, which are mutually connected via a bus 34.

Control unit 11 includes a non-illustrated CPU (central processing unit), which executes programs stored in RAM 32, and controls each unit included in information processing equipment 30. RAM 32 is a storage means for temporarily storing operation results from information processing equipment 30, and programs as well. Storage 33 is a nonvolatile storage means, such as hard disk, optical disk, magnetic disk and flash memory, for storing a variety of data and programs including an operating system (OS) before being read out to the RAM.

Peripheral equipment I/F 35 is an interface for connecting peripheral equipment to information processing equipment 30, including parallel port, USB (universal serial bus) port, and PCI card slot. As peripheral equipment, substrate 41 is included, as well as a wide variety of equipment sets such as printer, TV tuner, SCSI (small computer system interface), audio equipment, drive unit, memory card reader/writer, network interface card, wireless LAN card, modem card, keyboard/mouse, and display unit. Either wired or wireless connection is applicable for connecting the peripheral equipment to information processing equipment 30.

Input section 36 is an input means for inputting a user request, which includes the keyboard and the mouse, and may also include the drive unit for reading out information stored in a recording medium. Display unit 37 is a display means for providing information to the user, which includes a CRT (cathode ray tube) unit and an LCD (liquid crystal display) unit. As information processing equipment 30, a desktop PC, a notebook PC, a PDA (personal digital assistance), and a server may be applicable.

Figure 6A:
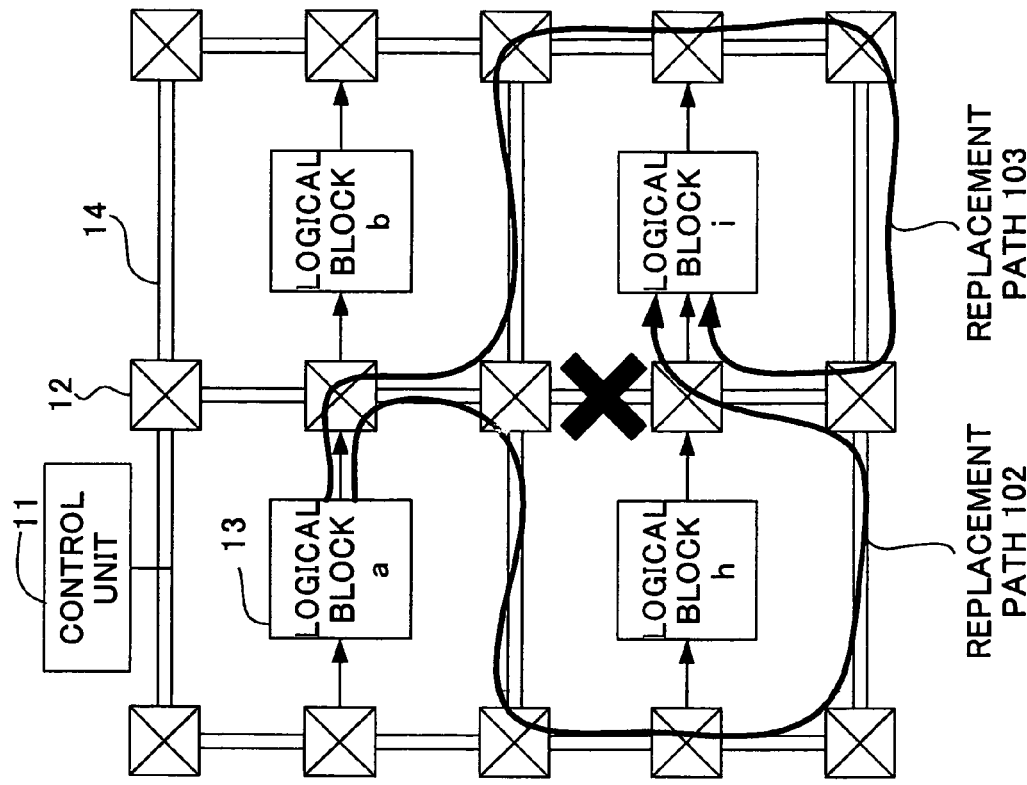
FIG. 6A shows a diagram illustrating a state of forming a path connecting between respective logical blocks in a PLD, according to the embodiment described in this specification of the present invention, explaining a case of the PLD having no fault.
Figure 6B:
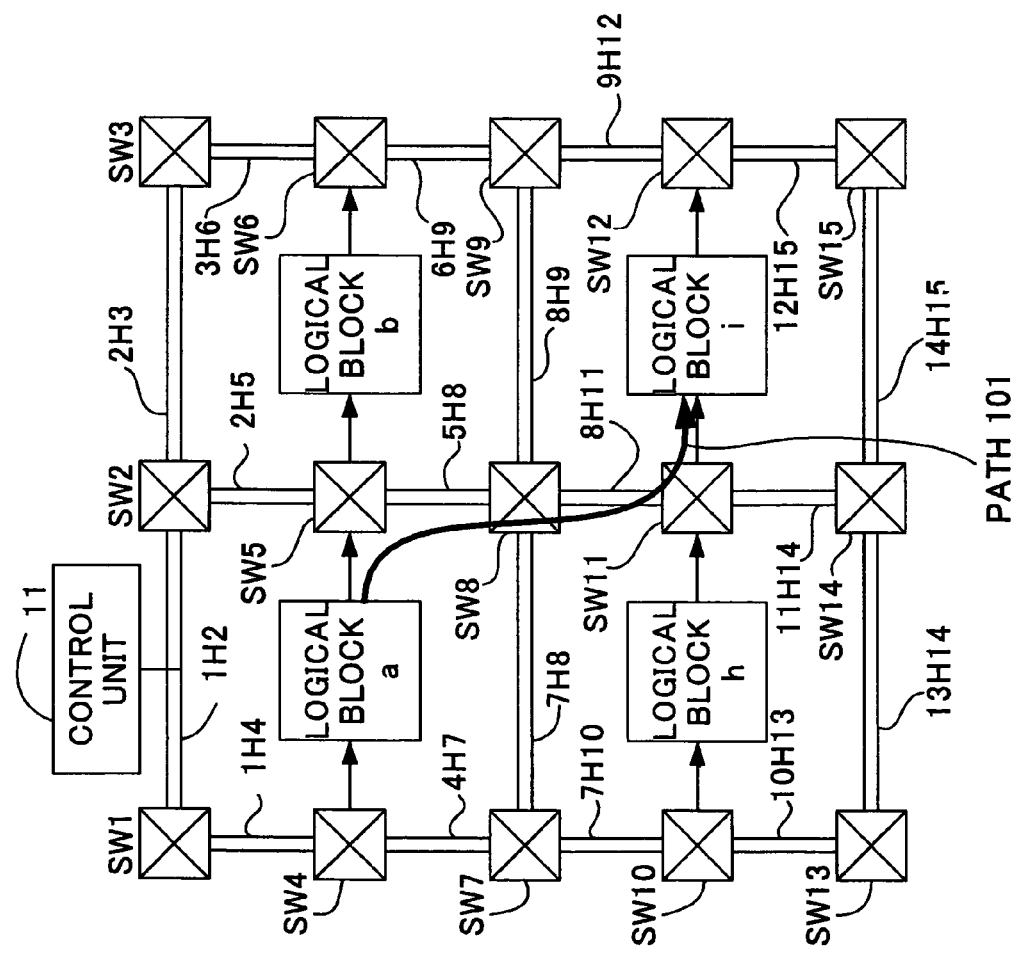
FIG. 6B shows a diagram illustrating a state of forming a path connecting between respective logical blocks in a PLD, according to the embodiment described in this specification of the present invention, explaining a case of the PLD having a fault in a certain wiring resource.

FIG. 6A, 6B are diagrams illustrating states of forming paths connecting respective logical blocks 13 in PLD 1 according to the embodiment described in this specification. FIG. 6A explains a case of the PLD having no fault, and FIG. 6B explains a case of the PLD having a fault in a certain wiring resource, respectively. In this specification, a path is identified by denoting identifiers for identifying resources included in the path concerned.

As shown in FIG. 6A, an identifier is assigned to each resource (switch 12, wiring resource 14) included in a path which connects each logical block 13. For example, in FIG. 6A, an identifier of 'SW'+numeral(s) is assigned as identifier of each switch 12, and an identifier of 'H' sandwiched by the numeral sets is assigned as identifier of each wiring resource. Here, in the identifier of wiring resource, the numerals before and after the symbol 'H' represent the numerical part of the identifier of switch 12 which is connected to the wiring resource concerned. For example, an identifier '13H14 ' signifies a wiring resource connecting between switches 'SW13 ' and 'SW14'.

When a defect point (fault resource) exists in PLD 1, and the resource corresponding to the defect point is being used in a path specified by the circuit information, a replacement path is prepared and used, as shown in FIG. 6B. For example, since no defect point exists in PLD 1 shown in FIG. 6A, switch SW5, wiring resource 5H8, switch SW8, wiring resource 8H11, and switch SW11 are used as a path 101 for connecting a logical block 'a' to a logical block 'i'. In contrast, in PLD 1 shown in FIG. 6B, the wiring resource 8H11 is faulty, and therefore the logical block 'a' and the logical block 'i' cannot be connected using path 101 shown in FIG. 6A. Accordingly, as shown in FIG. 6B, two replacement paths 102, 103 diverting the fault resource 8H11 are prepared, and either of the paths 102, 103 is used.

In such a way, even a defect point is found after the fabrication of the PLD, a predetermined logic circuit of an inherent PLD object can be realized by avoiding the defect point concerned. Thus, it becomes possible to remarkably improve the product yield of PLD 1, which conventionally has to be discarded only because a defect point is existent.

Now, a data structure of the data commonly used in the description of the embodiments will be explained below.

FIGS. 7A, 7B are diagrams illustrating exemplary data configurations of circuit information. FIG. 7A explains a case of the PLD having no fault point, and FIG. 7B explains a case of the PLD having a fault in a certain wiring resource, respectively. The circuit information shown in FIGS. 7A, 7B includes data items of 'logical block', 'path', and 'fault reflection completion flag'.

The 'logical block' information indicates which logical blocks are connected by a path specified by the circuit information. In FIG. 7A, as an example, a connection of 'a to i' is stored, which indicates the connection from the logical block 'a' to the logical block 'i' shown in FIG. 6A.

The 'path' information specifies a path used for the logical block connection, by means of resource identifiers used in the path concerned. In FIG. 7A, the resource identifiers used in path 101 shown in FIG. 6A are stored, as a path corresponding to the PLD having no fault point.

The 'fault reflection completion flag' is the flag information indicating whether or not the record concerned represents a replacement path. In FIG. 7A, because the PLD has no fault point, this record is not a replacement path, and accordingly 'No' is stored in the 'fault reflection completion flag', indicating that the path is not a replacement path.

Meanwhile, corresponding to FIG. 6B, FIG. 7B indicates the circuit information replaced by replacement path 103, as a result of the fault resource 8H11 existent in the path from the logical block 'a' to the logical block 'i'. Accordingly, when comparing the 'path' shown in FIG. 7A with the 'path' shown in FIG. 7B, it is known that the underlined portion is replaced by a diversion path which avoids the fault resource. Further, because the record shown in FIG. 7B indicates a replacement path, 'Yes' indicating a replacement path is stored in the 'fault reflection completion flag'.

FIG. 8 is a diagram illustrating an exemplary data configuration of defect point information stored in advance in a PLD, as a premise of the embodiments described in this specification. The defect point(s) can be identified by substantially 100% as a result of a shipping test performed after the PLD is fabricated, and the location of the defect point can be identified by the identifier assigned to the resource. Further, the defect point information specifies a defect point (fault resource), which includes data items of a 'resource ID' and a 'fault type'.

The 'resource ID' is an identifier assigned to each resource. As having been described in FIGS. 6A, 6B, each identifier is assigned to each switch 12 and each wiring resource 14. The 'fault type' is a number for identifying a fault type. For example, '1' denotes a fault that a transistor switch 21 cannot be turned on; '2' denotes a fault that the transistor switch cannot be turned off; '3' denotes a fault that a wire is short-circuited; and '4' denotes a fault having a high occurrence probability of a signal delay or a signal loss.

Additionally, in FIG. 8, as values stored in the resource ID, a certain resource is specified as a whole, such as switch SW1 and wiring resource 1H2. However, it is also possible to specify each fault resource in a more detailed level. Namely, an identifier for identifying each resource is more finely assigned for example the identification being assigned to each of a plurality of transistor switches 21 included in each switch 12, and to each of a plurality of signal lines 141 included in each wiring resource 14.

Figures 9A, 9B:
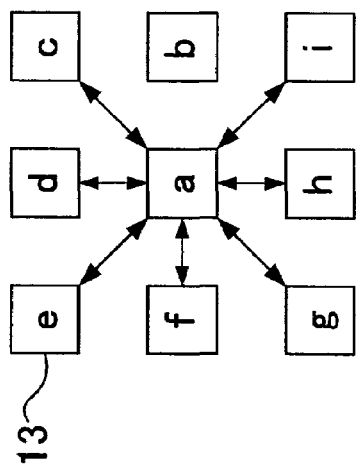
FIG. 9A shows diagrams illustrating relation of neighboring logical blocks to a certain logical block.
FIG. 9B shows an exemplary data configuration of a replacement rule table to be used when obtaining a replacement path.

FIG. 9A shows relation of neighboring logical blocks to a certain logical block, and FIG. 9B shows an exemplary data configuration of the replacement rule table for use when obtaining a replacement path.

As shown in FIG. 9A, when logical blocks 13 are disposed in a grid form, eight logical blocks 13 locate in the surrounding and neighboring positions to a single logical block 13. Thus, for each of the surrounding eight logical blocks centered by a certain logical block (here, logical block 'a' ), a replacement path is stored in the replacement rule table.

Here, in this specification, for the sake of simple explanation, it is assumed that a fault on wiring resource 14 only occurs on wiring resource 14 connecting between switches 12. Under this assumption, a replacement rule between the logical block 'a' and the neighboring logical block 'b' on the right does not exist. The reason is that a resource used for the connection between the logical block 'a' and the logical block 'b' is only one switch 12, and therefore no replacement path can be generated. However, as having been explained in FIG. 8, the above problem can be avoided when a fault resource is specified in more detailed level, or when a signal lines on input side 25 and output side 26 of logical block 13 are managed by identifiers which can be identified as fault resource. Accordingly, needless to say, there is a case that a replacement rule between the logical block 'a' and the neighboring logical block 'b' on the right can be generated.

As shown in FIG. 9B, the replacement rule table includes data items of 'logical block', 'path', 'fault position', 'replacement path', and 'delay time'. The 'logical block' information indicates a combination of neighboring logical blocks. In FIG. 9B, the records corresponding to the combinations of the logical blocks, from a combination of the logical block 'a' with the logical block 'c' (denoted as 'a to c'), to a combination of the logical block 'a' with the logical block 'i' (denoted as 'a to i' are stored.

The 'path' information specifies a path for use when no defect point exists in the PLD, by resource identifiers used in the path concerned. As an example, in FIG. 9B, the path connecting the logical block 'a' to the logical block 'i' is specified by use of listed identifiers, assuming that each resource identifier is assigned (numbered) as shown in FIG. 6A. Although paths between other logical blocks are not shown, these paths are also specified by listed identifiers which are assigned according to the policy similar to the above.

The 'fault position' information specifies a possible fault resource among the resources included in the 'path' concerned. Also, the 'replacement path' information specifies the replacement path to be used in the event that the resource specified by the 'fault position' becomes faulty, by means of the resource identifiers used in the replacement path concerned. The replacement path which diverts from the resource in the 'fault position' is adopted as long as a restriction condition related to the following 'delay time' is satisfied. For example, in FIG. 9B, it is to be understood that two paths are stored as replacement paths, which are available when the wiring resource 8H11 becomes faulty in the path connecting the logical block 'a' to the logical block 'i'. (This case corresponds to the replacement paths 102, 103 shown in FIG. 6B.) Lastly, the 'delay time' is a signal delay time produced when the 'replacement path' is used in place of the 'path'. The 'replacement path' is set in advance so that the 'delay time' is shorter than a predetermined delay time. In other words, a replacement path which diverts to a long way to avoid the fault resource is not stored in the record of the replacement rule table. The delay time can be obtained when the resources included in the replacement path are determined.

By referring to the replacement rule table shown in FIG. 9B, a replacement path in regard to the path between neighboring logical blocks can be obtained promptly. However, the entire replacement paths other than the path between neighboring logical blocks cannot be obtained only by referring to the replacement rule table. This problem can be solved by the method shown below.

Figure 10:
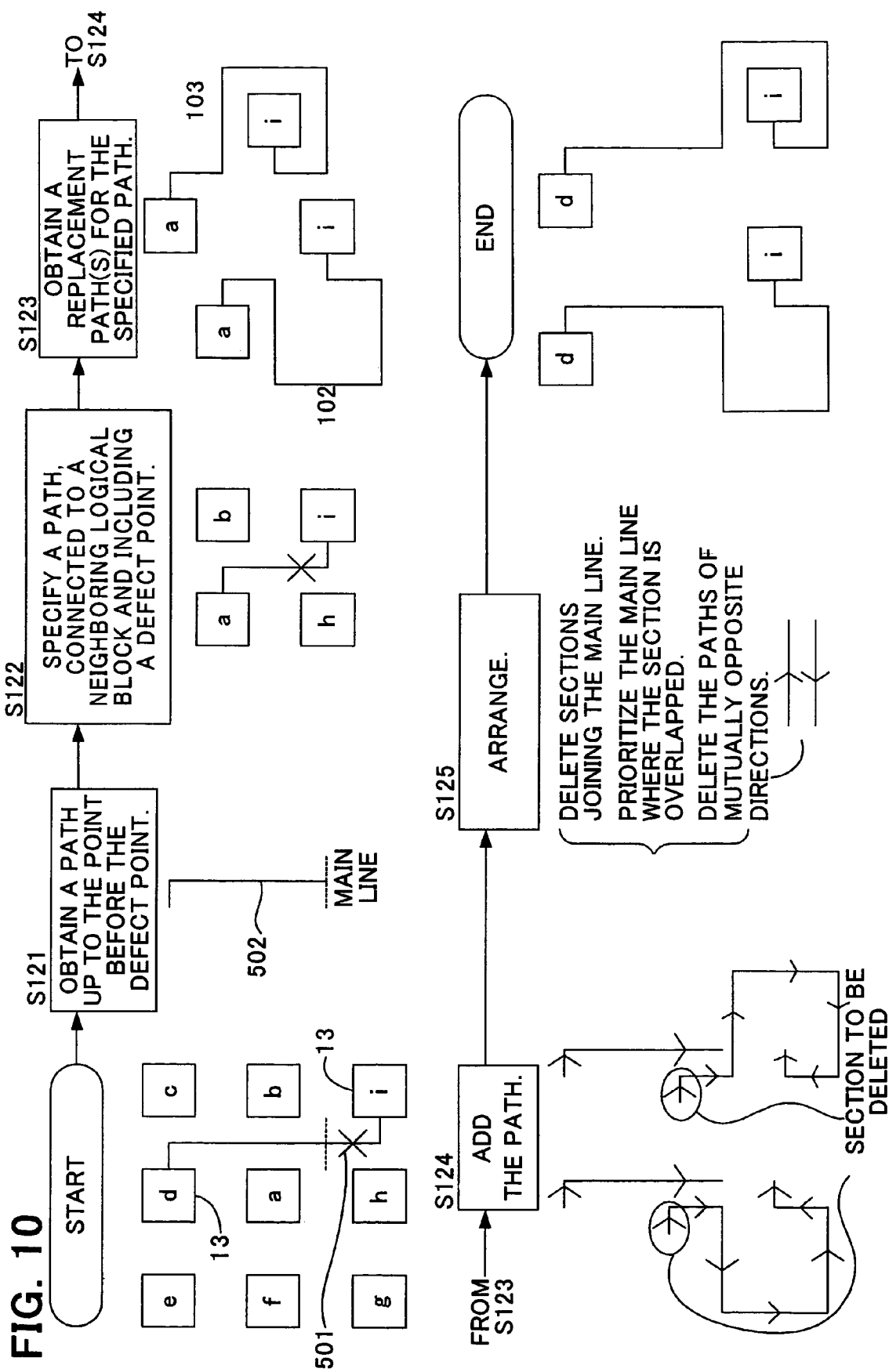
FIG. 10 shows a flowchart illustrating an example of a method for inducing a replacement path other than paths between neighboring logical blocks, using a replacement rule table.

FIG. 10 is a flowchart illustrating an example of a method for inducing a replacement path other than paths between neighboring logical blocks, using the replacement rule table. The flowchart illustrates a case of inducing replacement paths among the paths connecting a logical block 'd' to a logical block 'i', which are shown in 'Start' of FIG. 10, when a wiring resource 8H11 shown in FIG. 6A (i.e. a defect point 501 shown in FIG. 10) is faulty.

First, a path is obtained up to a point before the defect point on the path of interest (S121). Accordingly, a path 502 is obtained in step S121, and hereafter, this path 502 is referred to as main line (which cannot thoroughly be described by identifiers, because explanatory identifiers according to the numbered identification shown in FIG. 6A are not given here for the resources outside of the logical blocks 'a', 'b', 'h' and 'i').

Next, a path connecting a neighboring logical block and including defect point 501 is specified (S122). For example, in the case of wiring resource 8H11 (defect point 501), by referring the replacement rule table shown in FIG. 9B, logical block 'a' and logical block 'i' correspond to "the path connecting a logical blocks and including defect point 501".

Subsequently, replacement paths for the path specified in step S122 are obtained (S123). By referring to the replacement rule table shown in FIG. 9B, in the path connecting the logical block 'a' to the logical block 'i', two paths are specified as replacement paths when a fault position is the wiring resource 8H11. These paths correspond to replacement paths 102, 103 shown in FIG. 6B.

Next, main line 502 obtained in step S121 and the replacement paths obtained in step S123 are added (S124). This path addition operation in step S124 signifies that both paths are integrated into one, after positioning is made in a section which overlaps between the main line and the replacement path. In the example shown in FIG. 10, by quoting the numbered identifiers shown in FIG. 6A, a section having switch SW2, wiring resource 2H5, switch SW5, wiring resource 5H8, and switch SW8 are included in both the main line and the replacement path. Accordingly, by positioning in this section, the two paths can be integrated into one path. Additionally, in FIG. 10, a chart shown below step S124 illustrates the main line and the replacement path before the integration, in which each arrow represents the path direction.

On completion of integrating the main line with the replacement path, an arrangement process is performed so as to cut off the protruding portions (S125). In the arrangement process, first, a section in which the path joins the main line is deleted. This corresponds to a section ranging from the logical block 'a' to the switch SW5 in the replacement path. Further, as to the overlapped section used in positioning at the time of integration, a priority is given to main line 502. In addition, when there is an overlapped section in which arrows indicative of the path directions run in the mutually opposite directions, the section concerned is to be deleted, though such a case does not appear in the example shown in FIG. 10.

Through the above-mentioned process, finally such a path as shown below 'END' in FIG. 10 is induced as a replacement path for the path connecting the logical block 'a' to the logical block 'i' which are mutually not neighboring. The induced replacement path can be specified by the listed identifiers of the resources included in the path concerned, as in the case of an ordinary path. Here, if there are a plurality of replacement paths between the neighboring logical blocks obtained in step S123, the plurality of replacement paths are processed in parallel in this description. However, it may also be possible to select either one of the plurality of paths in step S123, and perform the subsequent process for the selected path only.

Instead of obtaining replacement paths between non-neighboring logical blocks by using the method shown in FIG. 10, it may also be possible to store the entire replacement paths with regard to a path between logical blocks, needless to say. However, the greater the number of the logical blocks becomes, the more vastly the number of combinations increases, and the more extensive memory space becomes necessary. Therefore, when reduction of memory capacity is required in spite of a large number of logical blocks, it is preferable that only replacement paths between neighboring logical blocks are stored in the replacement rule table, and other combinations are processed according to the algorithm shown in FIG. 10.

Based on the aforementioned description, hereafter PLD operation will be explained for each embodiment. As a premise of the following embodiments, the defect point information shown in FIG. 8 is stored in advance in the PLD. Further, the replacement rule table shown in FIG. 9B is stored in advance in the PLD, unless otherwise stated.

According to a first embodiment, a process for diverting from a defect point is performed when initiating a PLD. The PLD then refers to the defect point information and circuit information, and according to the circuit information, when a path for realizing a predetermined logic circuit to be formed from now has a fault resource, the PLD refers to the replacement rule table, induces a replacement path(s), and controls switch 12 so as to divert the fault resource.

FIGS. 11A, 11B are functional block diagrams each illustrating a control unit 11 of PLD 1 according to the first embodiment of the present invention. FIG. 11A represents a state of control unit 11 in a write phase, up to when circuit information is stored into the PLD, while FIG. 11B represents a state of control unit 11 in an initiation phase after the PLD is initiated.

A control unit 11 shown in FIGS. 11A, 11B includes a controller 60 and a storage 74. Controller 60 further includes a replacement control section 72 and a wiring resource section 73. Each functional section in controller 60 is realized by programs executed in a non-illustrated CPU provided in controller 60, or can be realized by hardware.

As described earlier in regard to the premise, storage 74 includes defect point information 51 (refer to FIG. 8) and a replacement rule table 52 (refer to FIG. 9B) in advance. In FIG. 11A, when storing the circuit information, circuit information 53 (refer to FIG. 7A) which is externally written is added into storage 74, without any particular processing.

Referring to FIG. 11B, on initiation of PLD 1, replacement control section 72 refers to defect point information 51, and decides whether a fault resource is included in a path specified by circuit information 53. When the fault resource is included, replacement control section 72 obtains a replacement path(s), and rewrites the circuit information with the information identifying the resource included in the replacement path. To obtain the replacement path, replacement control section 72 refers to replacement rule table 52, as having been illustrated in FIG. 10.

When circuit information 53 is rewritten with the information identifying the resource included in the replacement path, a record having 'Yes' in a 'fault reflection completion flag' is stored in storage 74, as shown in FIG. 7B. Hereafter, the circuit information at this state is referred to as fault-reflected circuit information 54. When fault-reflected circuit information 54 is generated, wiring resource section 73 reads the fault-reflected circuit information 54 from storage 74, and outputs a switch change signal for transistor switch 21, so as to form a predetermined logic circuit based on fault-reflected circuit information 54 being read out.

Figure 12:
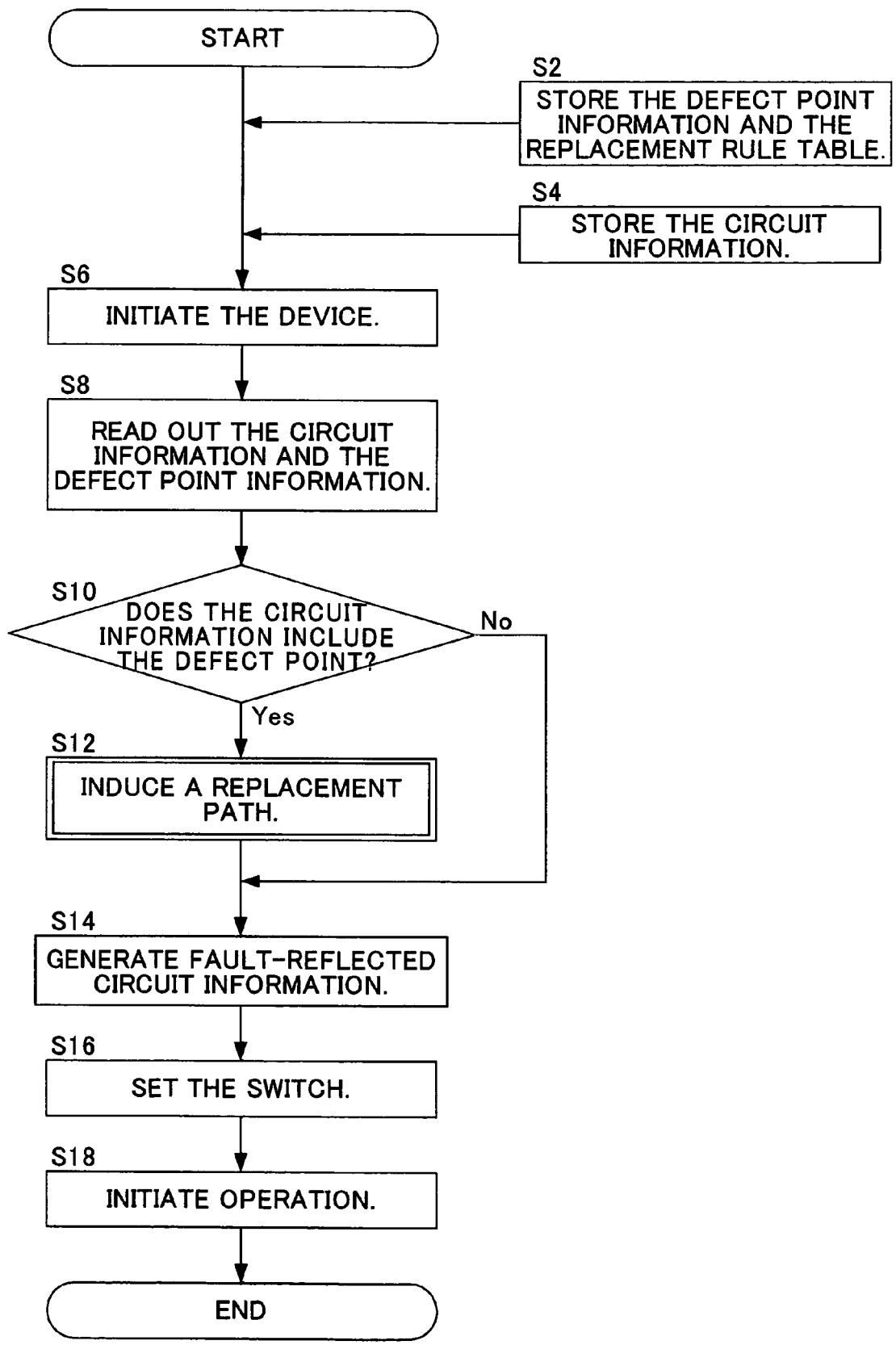
FIG. 12 shows a flowchart illustrating operation of a PLD in a first embodiment of the present invention.

FIG. 12 is a flowchart illustrating operation of PLD 1 in the first embodiment of the present invention. In storage 74, defect point information 51 and replacement rule table 52 are stored in advance (S2). Circuit information 53 is then added in a write phase (S4).

Thereafter, when PLD 1 is initiated (S6), replacement control section 72 reads out circuit information 53 and defect point information 51 (S8). Replacement control section 72 then confirms whether a defect point is included in the path specified by the readout circuit information 53 (S10). In step S10, replacement control section 72 decides whether there is a path containing a 'resource ID' included in defect point information 51, based on the circuit information (refer to FIG. 7A).

In step S10, if a defect point (fault resource) is included (Yes in S10), a replacement path is induced (S12) In step S12, when obtaining a replacement path between neighboring logical blocks, replacement control section 72 directly refers to the 'replacement path' item in replacement rule table 52. When obtaining a replacement path between non-neighboring logical blocks, replacement control section 72 refers to replacement rule table 52, and obtains a replacement path(s) according to the algorithm illustrated in FIG. 10.

Thereafter, by successively listing resource identifiers included in the replacement path induced in step S12, replacement control section 72 generates circuit information in which the fault is reflected (fault-reflected circuit information), and stores this information into storage 74 (S14). At this time, the 'fault reflection completion flag' is set to 'Yes', as shown in FIG. 7B.

When the generation of fault-reflected circuit information 54 is completed, wiring resource section 73 reads out this fault-reflected circuit information from storage 74, and outputs a switch change signal for transistor switch 21, so as to form a predetermined logic circuit based on the readout fault-reflected circuit information 54 (S16). Thus, PLD 1 starts operation, functioning as the predetermined logic circuit (S18).

According to the first embodiment described above, by providing a function of avoiding a defect point in a PLD from a shipping test result (defect point information) which is included in the PLD, it is possible to reduce the number of PLDs which are originally to be discarded as defective products, thereby improving the PLD production yield as a whole. The shipping test is performed after the PLD fabrication, and when implementing the present invention, it is not necessary to process in the wafer stage. Further, although avoidance of a defect point may produce a longer delay than in the path originally intended, the increment in delay is stored in the replacement rule table as 'delay time', and accordingly, it may also be possible to cope with a timing variation by incorporating the delay time into a timing model. Also, since the defect point information is included within each PLD, it is possible to manage the defect point information without being confused with defect point information of other devices.

Now, a second embodiment will be described hereafter. In the second embodiment, the process performed by replacement control section 72 when initiating a PLD in the first embodiment is performed at higher speed, by newly providing a write control section for performing circuit information write operation.

Figure 13A:
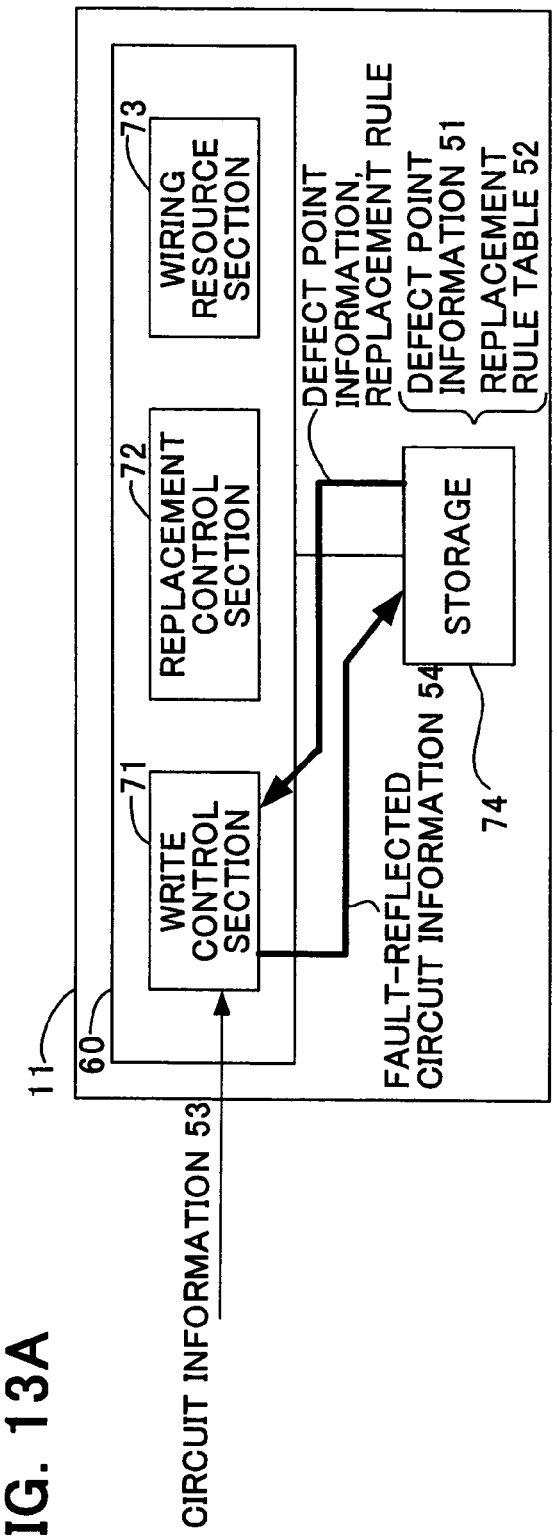
FIG. 13A shows a functional block diagram illustrating a control unit of a PLD according to a second embodiment of the present invention, which represents a control unit state in a write phase up to when circuit information is stored into the PLD.
Figure 13B:
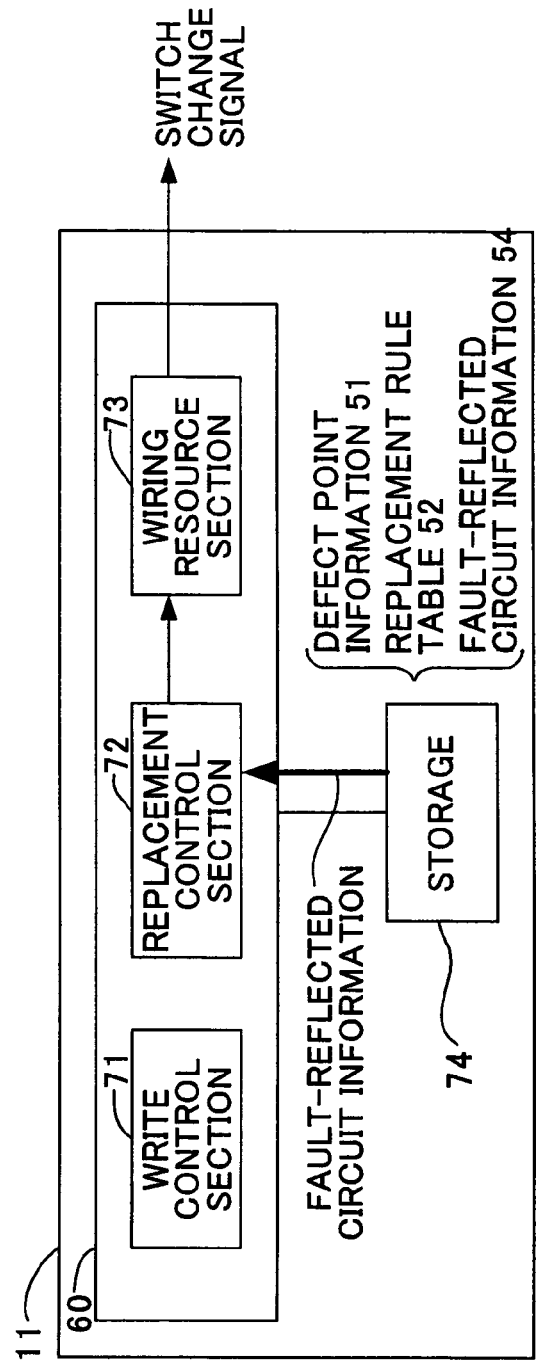
FIG. 13B shows a functional block diagram illustrating a control unit of a PLD according to a second embodiment of the present invention, which represents a control unit state in an initiation phase after the PLD is initiated.

FIGS. 13A, 13B are functional block diagrams each illustrating control unit 11 of PLD 1 according to the second embodiment of the present invention. FIG. 13A represents the state of control unit 11 in the write phase up to when circuit information is stored into the PLD, while FIG. 13B represents the state of control unit 11 in the initiation phase after the PLD is initiated.

A control unit 11 shown in FIGS. 13A, 13B includes a controller 60 and a storage 74. Controller 60 further includes a write control section 71, a replacement control section 72 and a wiring resource section 73. Each functional section in controller 60 is realized by programs executed in a non-illustrated CPU provided in controller 60, or can be realized by hardware.

As described earlier in regard to the premise, storage 74 includes defect point information 51 (refer to FIG. 8) and a replacement rule table 52 (refer to FIG. 9B) in advance. In FIG. 13A, when storing the circuit information, write control section 71 performs the same function as replacement control section 72.

More specifically, write control section 71 refers to defect point information 51, decides whether the path specified by circuit information 53 includes a fault resource. When the fault resource is included, write control section 71 obtains a replacement path(s), and stores fault-reflected circuit information 54 into storage 74.

Referring to FIG. 13B, on initiation of PLD 1, replacement control section 72 refers to the 'fault reflection completion flag' in the circuit information, and confirms whether the flag is 'Yes'. When fault-reflected circuit information 54 has been stored, the flag in the record concerned is 'Yes', and replacement control section 72 performs no particular processing, because a replacement path for avoiding the fault resource has already been obtained. Further, wiring resource section 73 reads out fault-reflected circuit information 54 stored in storage 74, and outputs a switch change signal for transistor switch 21, so as to form a predetermined logic circuit based on fault-reflected circuit information 54 being read out.

Figure 14:
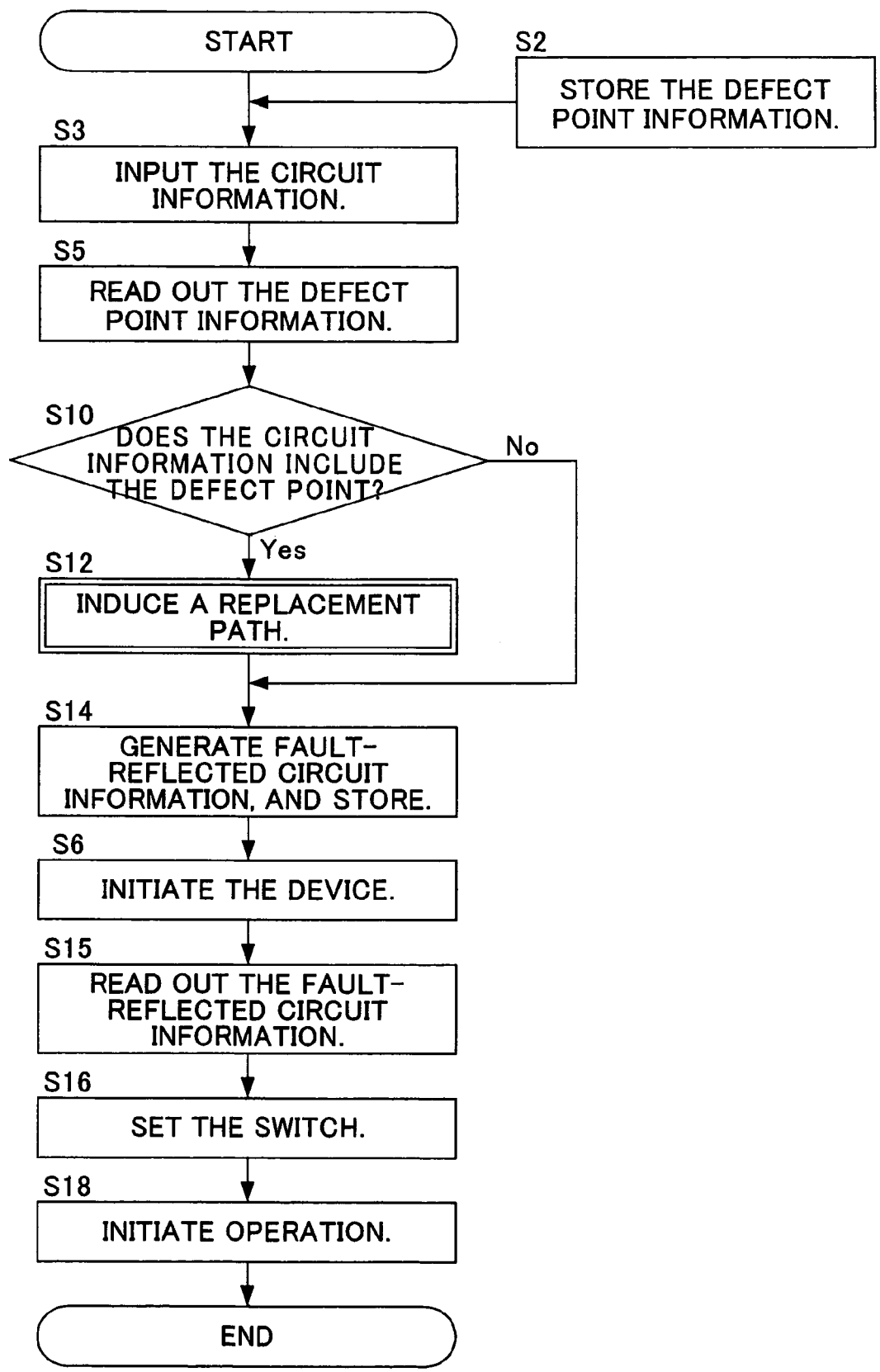
FIG. 14 shows a flowchart illustrating operation of PLD 1 in a second embodiment of the present invention.

FIG. 14 is a flowchart illustrating operation of PLD 1 in the second embodiment of the present invention. In storage 74, defect point information 51 and replacement rule table 52 are stored in advance (S2). Circuit information 53 is then added in a write phase (S3).

When the circuit information is input, write control section 71 reads out defect point information 51 (S5). Write control section 71 then confirms whether a defect point is included in the path specified by the input circuit information 53 (S10). In step S10, write control section 71 decides whether there is a path having a 'resource ID' included in defect point information 51, based on the input circuit information (refer to FIG. 7A).

In step S10, if a defect point (fault resource) is included (Yes in S10), a replacement path is induced (S12). In step S12, when obtaining a replacement path between neighboring logical blocks, write control section 71 directly refers to the 'replacement path' item in replacement rule table 52. When obtaining a replacement path between non-neighboring logical blocks, write control section 71 refers to replacement rule table 52, and obtains a replacement path(s) according to the algorithm illustrated in FIG. 10.

Thereafter, by successively listing resource identifiers included in the replacement path induced in step S12, write control section 71 generates fault-reflected circuit information, and stores this fault-reflected circuit information into storage 74 (S14). At this time, as shown in FIG. 7B, the 'fault reflection completion flag' is set to 'Yes'.

Thereafter, when PLD 1 is initiated (S6), replacement control section 72 reads out the circuit information (S15). In this case, because fault-reflected circuit information 54 has already been stored, replacement control section 72 performs no particular processing. Wiring resource section 73 then reads out fault-reflected circuit information 54 stored in storage 74, and outputs a switch change signal for transistor switch 21, so as to form a predetermined logic circuit based on the readout fault-reflected circuit information 54 (S16). Thus, PLD 1 starts operation functioning as the predetermined logic circuit (S18).

According to the aforementioned second embodiment, when fault-reflected circuit information 54 and circuit information 53 prior to the fault reflection are stored together in storage 74, if the readout information is fault-reflected circuit information 54, replacement control section 72 can omit the processing at the time of initiation, and accordingly high-speed initiation processing can be achieved. On the other hand, if the readout information is circuit information 53 prior to the fault reflection, the fault resource can be avoided by referring to the defect point information. Thus, it becomes possible to cope with the above both cases.

Next, a third embodiment will be described hereafter. In the third embodiment, the replacement control section provided in the second embodiment is omitted. The reason is that the replacement control section becomes unnecessary if fault-reflected circuit information is generated and stored when storing the circuit information.

Figure 15A:
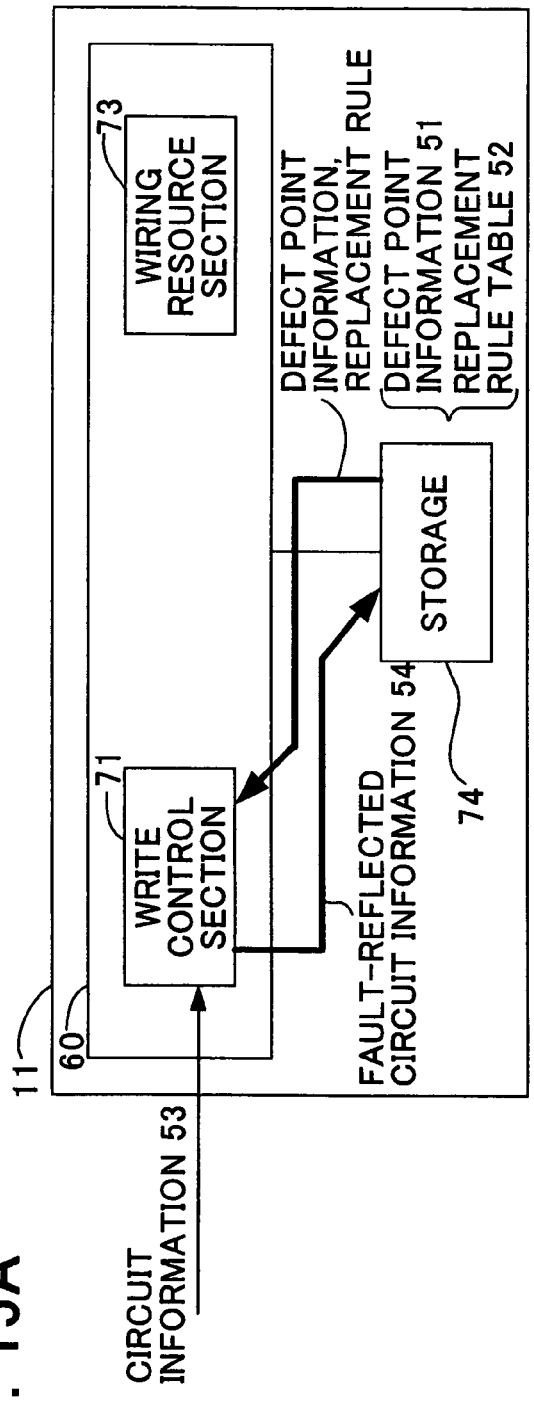
FIG. 15A shows a functional block diagram illustrating a control unit of a PLD according to a third embodiment of the present invention, which represents a control unit state in a write phase up to when circuit information is stored into the PLD.
Figure 15B:
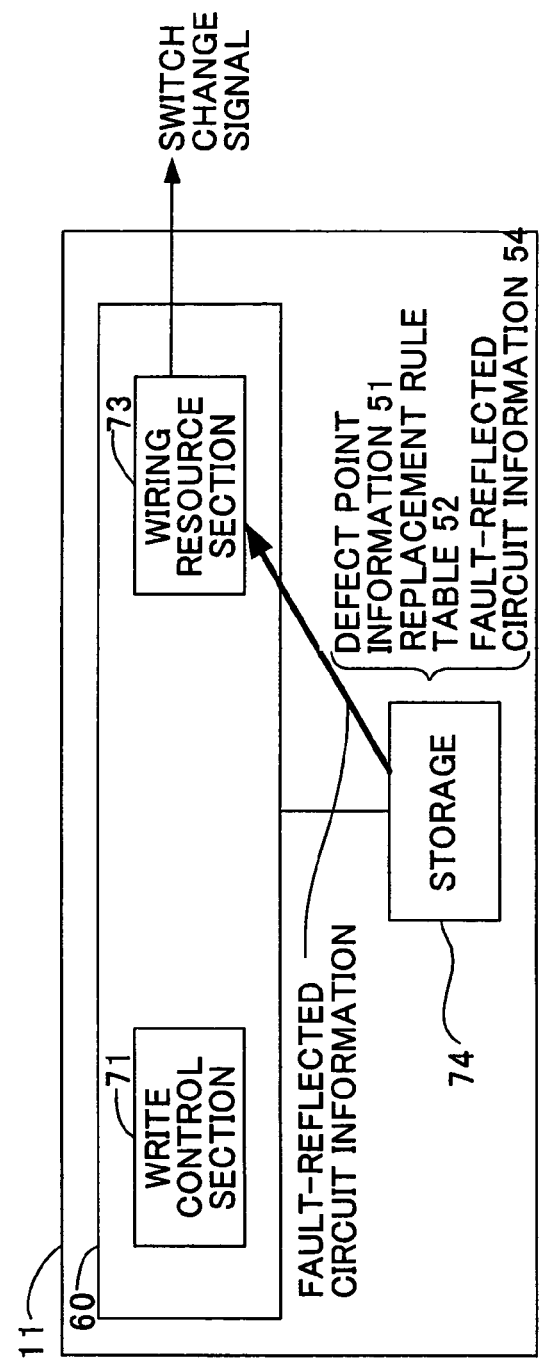
FIG. 15B shows a functional block diagram illustrating a control unit of a PLD according to a third embodiment of the present invention, which represents a control unit state in an initiation phase after the PLD is initiated.

FIGS. 15A, 15B show functional block diagrams each illustrating control unit 11 of PLD 1 according to the third embodiment of the present invention. FIG. 15A represents a state of control unit 11 in a write phase up to when circuit information is stored into the PLD, while FIG. 15B represents a state of control unit 11 in an initiation phase after the PLD is initiated.

Control unit 11 shown in FIGS. 15A, 15B includes a controller 60 and a storage 74. Controller 60 further includes write control section 71 and wiring resource section 73. Each functional section in controller 60 is realized by programs executed in a non-illustrated CPU provided in controller 60, or can be realized by hardware.

As described earlier in regard to the premise, storage 74 includes defect point information 51 (refer to FIG. 8) and a replacement rule table 52 (refer to FIG. 9B) in advance. The operation in a write phase shown in FIG. 15A is identical to that in the second embodiment, and therefore the explanation is omitted here. Further, in FIG. 15B, when PLD 1 is initiated, from the start, wiring resource section 73 reads out fault-reflected circuit information 54 stored in storage 74, and outputs a switch change signal for transistor switch 21, so as to form a predetermined logic circuit based on fault-reflected circuit information 54 being read out.

The operation of PLD 1 in the third embodiment is substantially identical to that in the second embodiment (FIG. 14). A different point from the second embodiment is that after step S6, step S15 for reading out circuit information by replacement control section 72 is omitted, and instead, step S16 is performed by wiring resource section 73.

In the first to the third embodiments described above, since induction of the replacement path is performed on the PLD side, time-consuming process is required for applying a single set of circuit information to a plurality of PLDs 1 including a defect point. For example, as shown in FIG. 16, information processing equipment 30 for processing the write operation to the PLDs is to apply, to a plurality of PLDs 1 having defect points, circuit information provided as information stored in recording medium 55, or as information input to another set of information processing equipment 30, via a communication means such as a network.

At this time, either replacement control section 72 works when initiating the PLD (the first embodiment) or write control section 71 works when storing circuit information 53 (the second embodiment or the third embodiment). In any cases, control unit 11 provided in each PLD processes defect point information 51 which is different PLD by PLD. Because operation capacity of each control unit 11 provided in PLD 1 is not sufficiently high, it may take a substantially long time for initiation processing of PLD 1 or write processing of circuit information 53.

In order to shorten the processing time for applying a single set of circuit information 53 to a plurality of PLDs 1, one idea is raised to introduce an information processing system as information processing equipment 30 having a relatively high operation capacity, with an incorporated function of write control section 71 as provided in the second and the third embodiments. This idea will be explained hereafter as a fourth embodiment.

Figure 17:
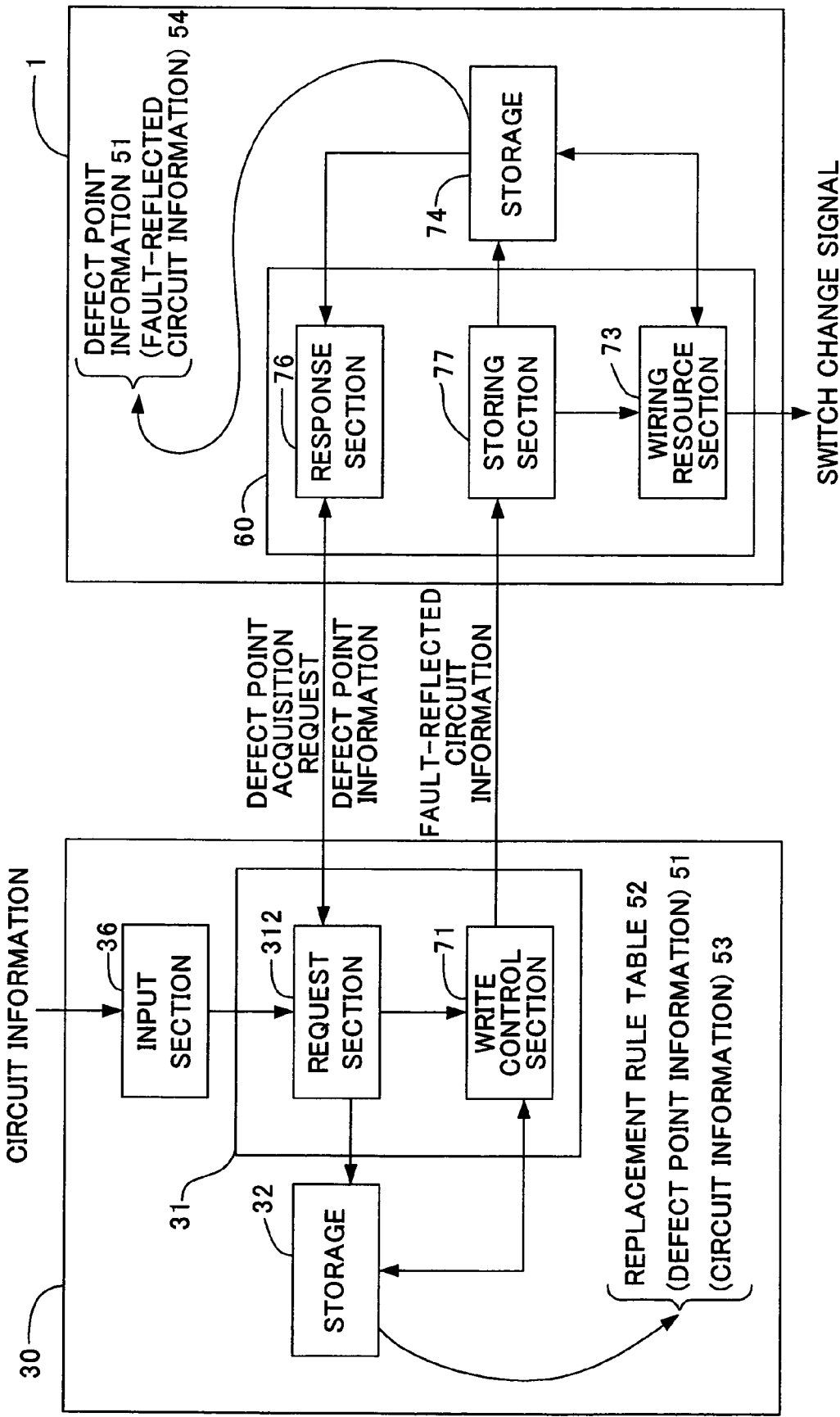
FIG. 17 shows a block diagram illustrating an information processing system in a fourth embodiment of the present invention.

FIG. 17 is a block diagram illustrating an information processing system in the fourth embodiment of the present invention. The information processing system shown in FIG. 17 is structured in such a way that necessary portions are extracted from the configurations of information processing equipment 30 and PLD 1 which are mutually connected via signal lines such as a parallel cable.

Information processing equipment 30 shown in FIG. 17 includes a processor 31, a storage 32, and an input section 36. Processor 31 further includes a request section 312 and a write control section 71. Each functional section in processor 31 is realized by programs executed in a non-illustrated CPU provided in processor 31, or can be realized by hardware.

Storage 32 includes a replacement rule table 52 (refer to FIG. 9B) in advance. Defect point information 51 and circuit information 53 shown in parenthesis are to be stored into storage 32 at a later time.

Input section 36 is composed of input means such as a keyboard and a mouse, and a drive unit for reading out a storage medium, as having been explained in FIG. 5. Through input section 36, circuit information is input to information processing equipment 30.

When circuit information 53 is input through input section 36, request section 312 outputs a defect point acquisition request to PLD 1, and stores the input circuit information 53 into storage 32 as well. Write control section 71 has the same function as the write control section provided in the second or the third embodiment. Namely, write control section 71 refers to the defect point information, decides whether a fault resource is included in a path specified by circuit information 53 being input through input section 36. If the fault resource is included, write control section 71 obtains a replacement path, and rewrites circuit information 53 having been input through input section 36 with the information specifying the resources included in the replacement path, as fault-reflected circuit information 54, and outputs this fault-reflected circuit information 54 to the PLD.

PLD 1 shown in FIG. 17 includes controller 60 and storage 74. Controller 60 further includes a response section 76, a storing section 77 and a wiring resource section 73. Each functional section in controller 60 is realized by programs executed in a non-illustrated CPU provided in controller 60, or can be realized by hardware.

As described earlier in regard to the premise, storage 74 includes defect point information 51 (refer to FIG. 8) in advance. Fault-reflected circuit information 54 shown in parenthesis is to be stored into storage 74 at a later time.

Response section 76 outputs defect point information 51 stored in storage 74 to information processing equipment 30, in response to the defect point acquisition request output from request section 312 in information processing equipment 30. Storing section 77 stores the circuit information (here, fault-reflected circuit information 54) input by information processing equipment 30 into storage 74. Wiring resource section 73 has the same function as the wiring resource section provided in the first through the third embodiments. Namely, wiring resource section 73 reads out the circuit information stored in storage 74, and outputs a switch change signal for transistor switch 21, so as to form a predetermined logic circuit based on the readout circuit information.

Figure 18:
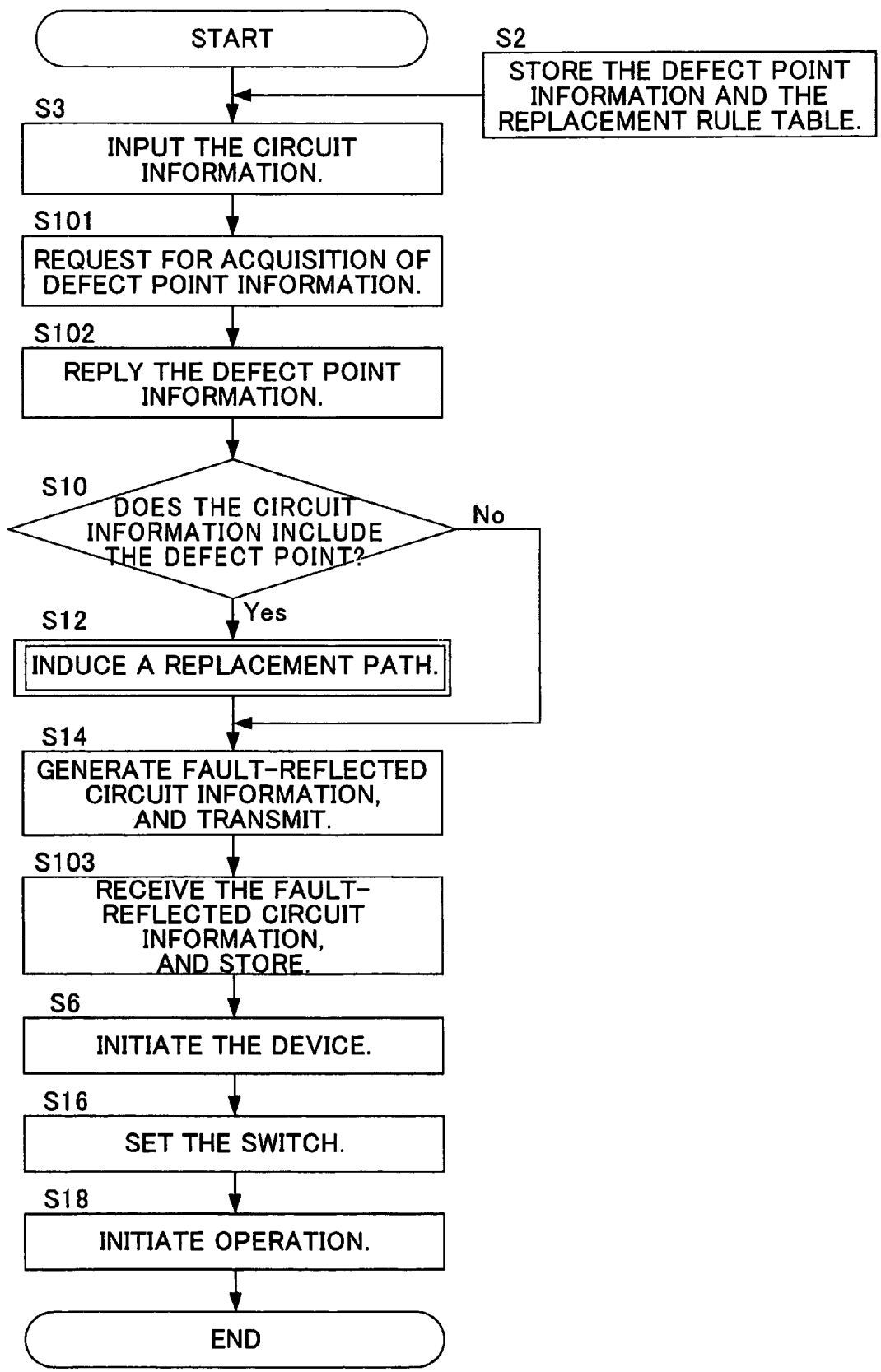
FIG. 18 shows a flowchart illustrating operation of an information processing system in a fourth embodiment of the present invention.

FIG. 18 is a flowchart illustrating operation of the information processing system in the fourth embodiment of the present invention. In storage 74 of PLD 1, defect point information 51 is stored in advance, and in storage 32 of information processing equipment 30, a replacement rule table 52 is stored (S2). In a write phase, circuit information 53 is input through input section 36 of information processing equipment 1 (S3).

Then, request section 312 in information processing equipment 30 outputs a defect point acquisition request to PLD 1, and stores the input circuit information 53 into storage 32 as well (S101). In response to the defect point acquisition request input from information processing equipment 30, response section 76 in PLD 1 outputs defect point information 51 stored in storage 74 to information processing equipment 30 (S102).

In information processing equipment 30, request section 312 stores defect point information 51 output in step S102 into storage 32, and also outputs this defect point information 51 to write control section 71. Write control section 71 confirms whether a defect point is included in the path specified by circuit information 53 having been input through input section 36, by referring to defect point information 51 stored in storage 32 through request section 312 (S10). In step S10, write control section 71 decides whether there is a path having a 'resource ID' included in defect point information 51, based on circuit information 53 (refer to FIG. 7A).

In step S10, if a defect point (fault resource) is included (Yes in S10), a replacement path is induced (S12). In step S12, when obtaining a replacement path between neighboring logical blocks, write control section 71 directly refers to the 'replacement path' item in replacement rule table 52. When obtaining a replacement path between non-neighboring logical blocks, write control section 71 refers to replacement rule table 52, and obtains a replacement path(s) according to the algorithm illustrated in FIG. 10.

Thereafter, by successively listing resource identifiers included in the replacement path induced in step S12, write control section 71 generates fault-reflected circuit information, and outputs the above-generated information to PLD 1 (S14). At this time, as shown in FIG. 7B, the 'fault reflection completion flag' is set to 'Yes'. In PLD 1, storage section 77 stores fault-reflected circuit information 54 input from information processing equipment 30 into storage 74 (S103).

Thereafter, when PLD 1 is initiated (S6), wiring resource section 73 reads out fault-reflected circuit information 54 stored in storage 74, and outputs a switch change signal for transistor switch 21, so as to form a predetermined logic circuit based on the readout fault-reflected circuit information 54 (S16). Thus, PLD 1 starts operation, functioning as the predetermined logic circuit (S18).

According to the above-mentioned fourth embodiment, when writing circuit information, by incorporating outside a PLD a function for avoiding a defect point using defect point information stored in the PLD, it becomes possible to easily apply a single set of master circuit information to a plurality of PLDs, even when defect points which are different PLD by PLD are existent. Further, in this embodiment, it is not necessary to provide inside the device a function for avoiding a defect point. Namely, it becomes unnecessary to perform replacement control (replacement path induction) each time the PLD is initiated, and accordingly the PLD can be made into an operation start state within a substantially short time. Further, according to the information processing system in this fourth embodiment, if a defect point is displayed on a display section of the information processing equipment, as resource of prohibited use, and allocation and wiring are performed based on the displayed information, an optimal design may be achieved for the PLD concerned.

Figure 19:
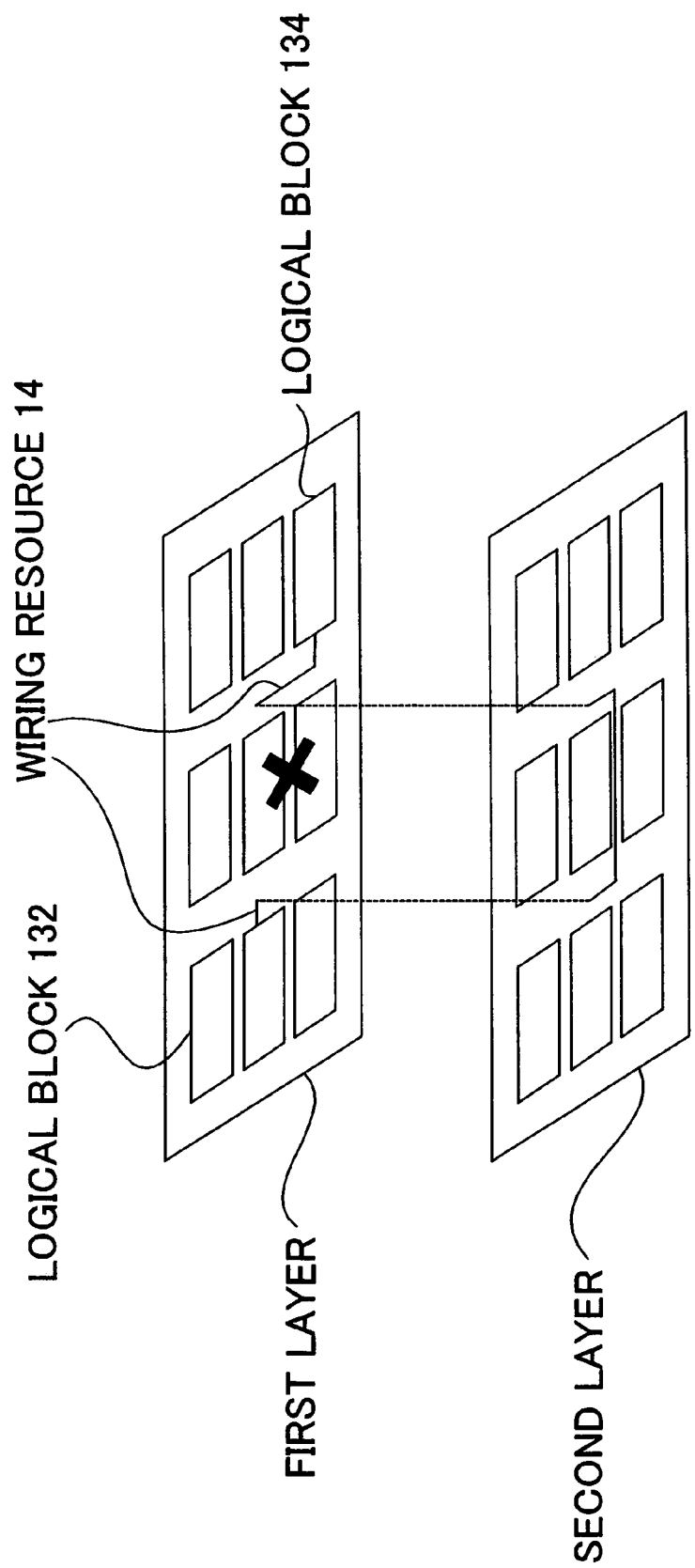
FIG. 19 shows a diagram illustrating a replacement path in case of a multi-layered wiring structure.

Additionally, according to the first to the fourth embodiments, to obtain a replacement path(s), the path avoiding a fault resource is searched in a two-dimensional plane. However, when the PLD has wiring of a multi-layered structure, the replacement path may also be searched in a three-dimensional space. For example, as shown in FIG. 19, in case a path from a logical block 132 to a logical block 134 is not available because of a fault point in the first layer (marked by X), it is possible to obtain a replacement path via the second layer.

To summarize, according to the present invention, by providing a function in a PLD for avoiding the defect point using a shipping test result (defect point information) included within the PLD concerned, the number of PLDs to be discarded as defective products can be reduced, thereby enabling improvement of the product yield as a whole. Since the shipping test is carried out after the PLD fabrication, when implementing the present invention, no process is needed in a wafer stage. Avoiding a defect point may possibly increase a delay, as compared with the delay to be produced by an originally planned path. However, because the delay increment is stored in a replacement rule table as 'delay time', by incorporating the stored delay time into a timing model, it becomes possible to cope with a timing variation. Further, because each PLD internally has defect point information, management is possible without being confused by mixed defect point information of other devices.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A programmable logic device comprising:
   a plurality of logical blocks including programmable logic circuits;
   a storage which stores in advance circuit information specifying a path connecting the plurality of logical blocks using information identifying resources included in the path, and defect point information identifying a fault resource;
   a replacement control section which refers to the defect point information, decides whether the fault resource is included in the path specified by the circuit information, and when the fault resource is included, obtains a replacement path, and rewrites the circuit information with the information identifying the resources included in the replacement path; and
   a wiring resource section which reads out the circuit information stored in the storage, and forms a predetermined logic circuit based on the circuit information read out.

2. The programmable logic device according to claim 1, further comprising:
   a write control section which refers to the defect point information when the circuit information is stored into the storage, decides whether a fault resource is included in the path specified by the circuit information, obtains the replacement path when the fault resource is included, and rewrites the circuit information with the information identifying resources included in the replacement path.

3. The programmable logic device according to claim 2, wherein a fault reflection completion flag, which indicates whether the path of interest is a replacement path having been rewritten to reflect the defect point information, is stored correspondingly to the path specified by the circuit information, and
   when rewriting the circuit information, the write control section updates the fault reflection completion flag of the path replaced by the replacement path to information indicating the defect point information has been reflected, and
   the replacement control section first refers to the fault reflection completion flag included in the circuit information in the storage, and does not perform the decision for the path of which fault reflection flag indicates the fault point information has been reflected.

4. The programmable logic device according to claim 1, wherein the storage stores a replacement rule table which includes a path connecting mutually neighboring logical blocks, a resource possibly faulty among resources included in the path connecting the neighboring logical blocks, and a replacement path for use when the resource possibly faulty becomes actually faulty, and
   wherein the replacement path is obtained based on the replacement rule table.

5. An apparatus having a programmable logic device according to claim 1 being mounted thereon.

6. A programmable logic device comprising:
   a plurality of logical blocks including programmable logic circuits;
   a storage which stores circuit information specifying each path connecting the above plurality of logical blocks using information identifying resources included in the path, and stores in advance defect point information for identifying a fault resource;
   a write control section which refers to the defect point information when the circuit information is stored into the storage, decides whether the fault resource is included in the path specified by the circuit information, obtains a replacement path when the fault path is included, and rewrites the circuit information with the information identifying resources included in the replacement path; and
   a wiring resource section which reads out the circuit information stored in the storage, and forms a predetermined logic circuit based on the circuit information read out.

7. A control program in a programmable logic device having a plurality of logical blocks including programmable logic circuits, a storage which stores in advance circuit information specifying a path connecting the plurality of logical blocks using information identifying resources included in the path, defect point information identifying a fault resource, and the control program, and a controller reading out and executing the control program, said control program enabling the programmable logic device to realize:
   a replacement control section which refers to the defect point information, decides whether the fault resource is included in the path specified by the circuit information, obtains a replacement path when the fault resource is included, and rewrites the circuit information with information identifying the resources included in the replacement path; and
   a wiring resource section which reads out the circuit information stored in the storage, and forms a predetermined logic circuit based on the circuit information read out.

8. The control program according to claim 7, further enabling the programmable logic device to realize:
   a write control section which refers to the defect point information when the circuit information is stored into the storage, decides whether the fault resource is included in the path specified by the circuit information, obtains a replacement path when the fault resource is included, and rewrites the circuit information with information identifying the resources included in the replacement path.

9. The control program according to claim 8,
   wherein a fault reflection completion flag, which indicates whether the path of interest is a replacement path having been rewritten to reflect the defect point information, is stored correspondingly to the path specified by the circuit information, and
   when rewriting the circuit information, the write control section updates the fault reflection completion flag of the path replaced by the replacement path to information indicating the defect point information has been reflected, and
   the replacement control section first refers to the fault reflection completion flag included in the circuit information in the storage, and does not perform the decision for the path of which fault reflection flag indicates the fault point information has been reflected.

10. The control program according to claim 7,
    wherein the storage stores a replacement rule table which includes a path connecting mutually neighboring logical blocks, a resource possibly faulty among resources included in the path connecting the neighboring logical blocks, and a replacement path for use when the resource possibly faulty becomes actually faulty, and wherein the replacement path is obtained based on the replacement rule table.

11. A circuit forming method for a programmable logic device having a plurality of logical blocks including programmable logic circuits, and a storage which stores in advance circuit information specifying a path connecting the plurality of logical blocks using information identifying resources included in the path and defect point information identifying a fault resource, said circuit forming method comprising:

deciding whether the fault resource is included in the path specified by the circuit information with referring to the defect point information;

on deciding that the fault resource is included in the path, rewriting the circuit information with the information identifying the resources included in the replacement path with obtaining a replacement path; and by reading out the circuit information stored in the storage, forming a predetermined logic circuit based on the circuit information read out.

12. The circuit forming method according to claim 10, wherein, when the circuit information is stored into the storage, said deciding is performed.

13. The circuit forming method according to claim 11, wherein a fault reflection completion flag, which indicates whether the path of interest is a replacement path having been rewritten to reflect the defect point information, is stored correspondingly to the path specified by the circuit information, wherein when the circuit information is stored into the storage, and in case the circuit information is rewritten, the fault reflection completion flag of the path replaced by the replacement path is updated to information indicating the defect point information has been reflected, and wherein said deciding for a path is not performed if a fault reflection flag of the path indicates the fault point information has been reflected.

14. The circuit forming method according to claim 11, wherein the storage stores a replacement rule table which includes a path connecting mutually neighboring logical blocks, a resource possibly faulty among resources included in the path connecting the neighboring logical blocks, and a replacement path for use when the resource possibly faulty becomes actually faulty, and wherein the replacement path is obtained based on the replacement rule table.

15. A circuit design system comprising:

a programmable logic device having a plurality of logical blocks including programmable logic circuits, receiving input circuit information specifying paths connecting the plurality of logical blocks, and forming a predetermined logic circuit based on the input circuit information; and information processing equipment being connected to the programmable logic device via signal lines, and outputting the circuit information to the programmable logic device, said programmable logic device further comprising:

a storage storing in advance defect point information identifying a fault resource;

a response section outputting the defect point information stored in the storage to the information processing equipment, in response to a defect point acquisition request being input from the information processing equipment;

a storing section storing the circuit information input from the information processing equipment to the storage; and a wiring resource section reading out the circuit information stored in the storage, and forming a predetermined logic circuit based on the circuit information read out, and said information processing equipment further comprising:

an input section for inputting the circuit information;

a request section outputting the defect point acquisition request to the programmable logic device, when the circuit information is input via the input section; and a write control section which refers to the defect point information input from the programmable logic device, decides whether a fault resource is included in the path specified by the circuit information input via the input section, and when the fault resource is included, obtains a replacement path, and rewrites the circuit information input via the input section with the information identifying resources included in the replacement path, and outputs the rewritten circuit information to the programmable logic device.

* * * * *